(12) United States Patent
Wang et al.

(10) Patent No.: US 7,394,661 B2
(45) Date of Patent: Jul. 1, 2008

(54) SYSTEM AND METHOD FOR PROVIDING A FLASH MEMORY ASSEMBLY

(75) Inventors: Kuang-Yu Wang, Saratoga, CA (US); Charles C. Lee, Sunnyvale, CA (US); Horng-Yee Chou, Palo Alto, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 529 days.

(21) Appl. No.: 10/882,539

(22) Filed: Jun. 30, 2004

(65) Prior Publication Data

US 2006/0002096 A1    Jan. 5, 2006

(51) Int. Cl.
*H05K 5/03* (2006.01)
(52) U.S. Cl. .................. 361/737; 361/752; 174/50.52; 439/135
(58) Field of Classification Search .......... 361/737, 361/752, 730, 728, 729; 439/131, 135–141, 439/79, 377, 76.1; 235/492; 174/50.52, 174/50.53
See application file for complete search history.

(56) References Cited

U.S. PATENT DOCUMENTS

| | | | | |
|---|---|---|---|---|
| 5,153,396 A | * | 10/1992 | Cummings | 200/83 Q |
| 5,920,459 A | * | 7/1999 | Weber et al. | 361/752 |
| 6,778,401 B1 | * | 8/2004 | Yu et al. | 361/752 |
| 6,877,994 B2 | * | 4/2005 | Huang | 439/76.1 |
| 6,932,629 B2 | * | 8/2005 | Ikenoue | 439/138 |
| 6,999,322 B1 | * | 2/2006 | Lin | 361/752 |
| 7,004,794 B2 | * | 2/2006 | Wang et al. | 439/660 |
| 7,035,110 B1 | * | 4/2006 | Wang et al. | 361/737 |
| 7,052,287 B1 | * | 5/2006 | Ni et al. | 439/76.1 |
| 7,074,052 B1 | * | 7/2006 | Ni et al. | 439/76.1 |
| 7,095,617 B1 | * | 8/2006 | Ni | 361/736 |
| 7,259,967 B2 | * | 8/2007 | Ni | 361/760 |
| 7,269,004 B1 | * | 9/2007 | Ni et al. | 361/686 |

* cited by examiner

*Primary Examiner*—Diego Gutierrez
*Assistant Examiner*—Dameon E Levi
(74) *Attorney, Agent, or Firm*—Bever, Hoffman & Harms, LLP; Patrick T. Bever

(57) ABSTRACT

The present invention relates to a method and system for providing a flash memory assembly. The flash memory assembly includes a connector and a printed circuit board (PCB) coupled to the connector. The center of the PCB is positioned substantially at the center of the connector. An electronic component is coupled to one side of the PCB. In another aspect of the present invention, a second electronic component is coupled to a second side of the PCB. In another aspect of the present invention, the electronic components and the PCB are protected by covers joined using interference fitting or ultrasonic joining. In another aspect of the present invention, a cap protects the connector. The cap can be removably coupled to the connector.

31 Claims, 18 Drawing Sheets

Logical / Physical Block Address Translation Look Up Table (LUT)

500

600

1800

1900

2300

2400

2400

2400

SYSTEM AND METHOD FOR PROVIDING A FLASH MEMORY ASSEMBLY

RELATED CO-PENDING PATENT APPLICATIONS

The present invention is related to a co-pending U.S. application Ser. No. 10/789,333, filed on Mar. 10, 2004, and entitled "System and Method for Controlling Flash Memory."

FIELD OF THE INVENTION

The present invention relates to memory systems, and more particularly to a system and method for providing a flash memory assembly.

BACKGROUND OF THE INVENTION

As flash memory technology becomes more advanced, flash memory is replacing traditional magnetic hard disks as storage media for mobile systems. Flash memory has significant advantages over magnetic hard disks, such as having high-gravity resistance and low power dissipation. Because of the smaller physical sizes of flash memory, they are also more conducive to mobile systems. Accordingly, the flash memory trend has been growing because of its compatibility with mobile systems and the low-power feature.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition to replacing hard drives, flash memory is also replacing floppy disks because flash memory provides higher storage capacity and faster access speeds than floppy disks.

While flash memory is physically small and convenient to carry around, the trade off is that it has limited storage capacity. It has a significantly higher storage capacity than floppy disks but a smaller storage capacity than hard disks. Nonetheless, the key features of flash memory are low power and mobility.

Flash memory is typically implemented in an assembly, which includes a flash memory device mounted onto a printed circuit board and coupled to a USB connector. The USB connector plugs into a host receptacle. Such a general configuration is well known. Because of its smaller size, flash memory can be conveniently carried in briefcases, backpacks, purses, pockets, etc.

A potential problem with flash memory being so mobile is that it is susceptible to breakage when being transported. A conventional solution is to protect the flash memory with a cover or housing. The housing must be sufficiently robust. However, since an advantage of flash memory is mobility, it is important that it remain light and compact.

Accordingly, what is needed is an improved system and method for implementing flash memory. The system and method should be able to comply with the USB standard, should sufficiently protect a flash memory device when being transported, and should be simple, cost effective and capable of being easily adapted to existing technology. The present invention addresses such a need.

SUMMARY OF THE INVENTION

A flash memory assembly is disclosed. The flash memory assembly comprises a connector and a printed circuit board (PCB) coupled to the connector. The center of the PCB is positioned substantially at the center of the connector. An electronic component is coupled to one side of the PCB. In another aspect of the present invention, a second electronic component is coupled to a second side of the PCB. In another aspect of the present invention, the electronic components and the PCB are protected by covers joined using interference fitting or ultrasonic joining. In another aspect of the present invention, a cap protects the connector. The cap can be removably coupled to the connector.

DETAILED DESCRIPTION OF THE INVENTION

The present invention relates to memory systems, and more particularly to a system and method for providing a flash memory assembly. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A system and method in accordance with the present invention for providing a flash memory assembly are disclosed. The flash memory assembly is configured to accommodate multiple flash memory components on both sides of a printed circuit board, while maintaining a thin and compact size. Also, the flash memory assembly includes features that increase the durability of the flash memory assembly when being handled or transported. To more particularly describe the features of the present invention, refer now to the following description in conjunction with the accompanying figures.

Although the present invention disclosed herein is described in the context of assemblies for USB connectors and flash memory components, the present invention may apply to assemblies for other types of connectors and other types of integrated circuit devices and still remain within the spirit and scope of the present invention.

Figure 1:
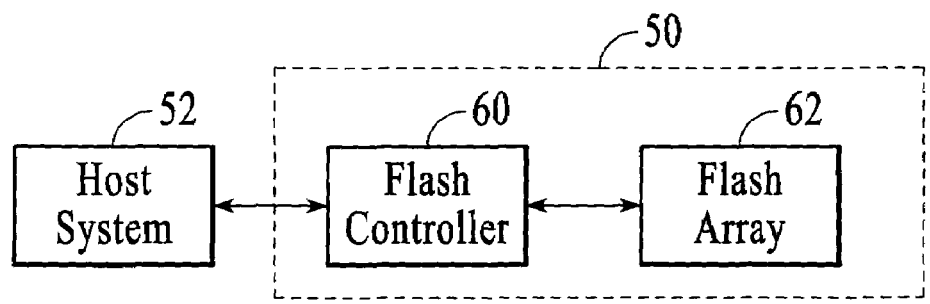
FIG. 1 is a block diagram of a conventional flash memory system coupled with a host system.

FIG. 1 is a block diagram of a conventional flash memory system 50 coupled with a host system 52. The flash memory system 50 includes a flash memory controller 60 and a flash memory 62. In operation, the host system 52 sends write and read requests to the flash memory controller 60. Data is written to and read from the flash memory 62. The host system 52 provides resources to process write and read transactions, and erase operations via the flash memory controller 60.

Figure 2:
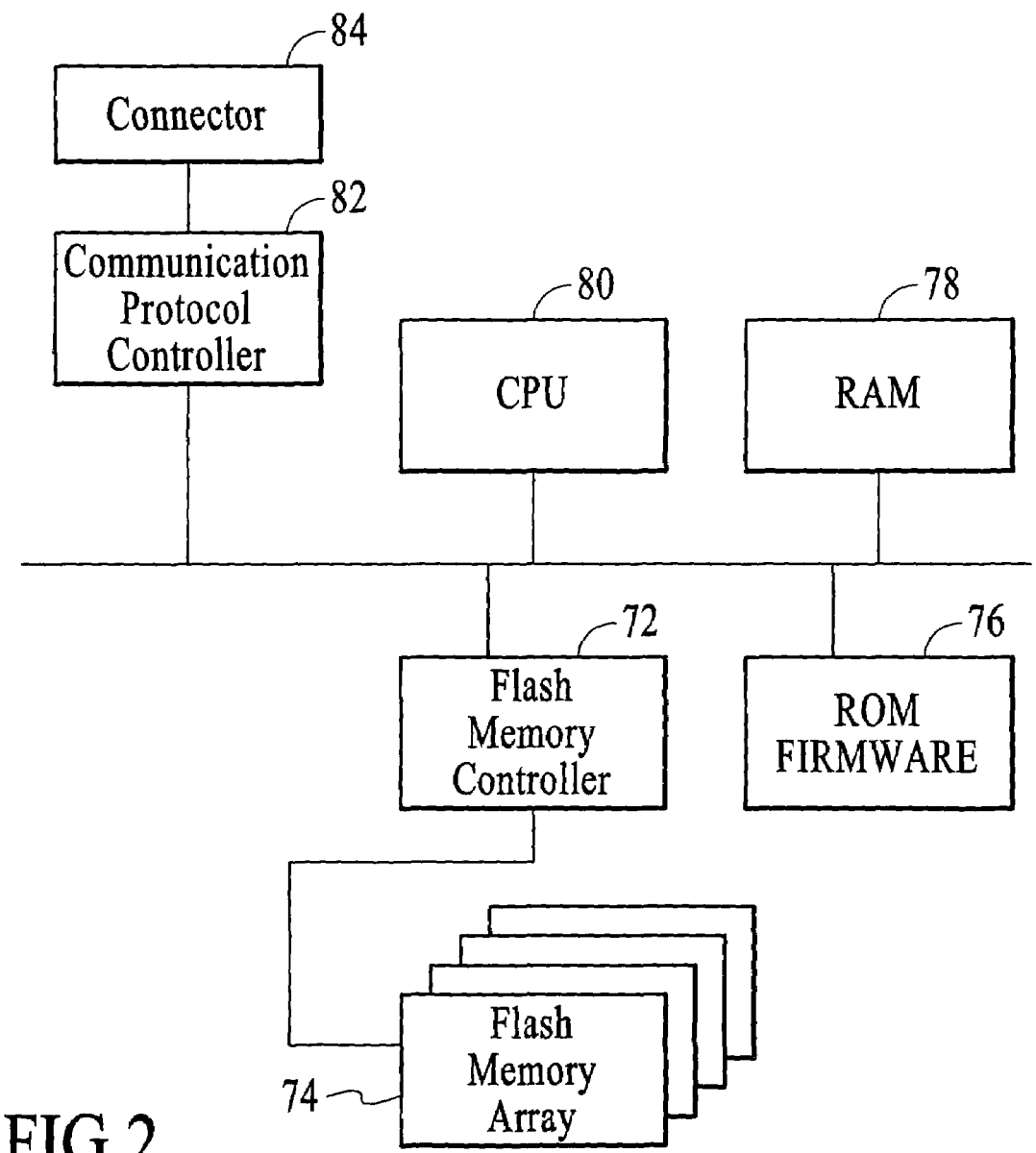
FIG. 2 is a block diagram of a flash memory system, which can be used to implement the flash memory system of FIG. 1.

FIG. 2 is a block diagram of a flash memory system 70, which can be used to implement the flash memory system 50 of FIG. 1. The flash memory system 70 includes a flash memory controller 72, a flash memory array 74, read-only memory (ROM) firmware 76, random-access memory (RAM) 78, a central processing unit (CPU) 80, a communication protocol controller 82, and a connector 84 for connecting to a host system.

Flash Memory System

Figure 3A:
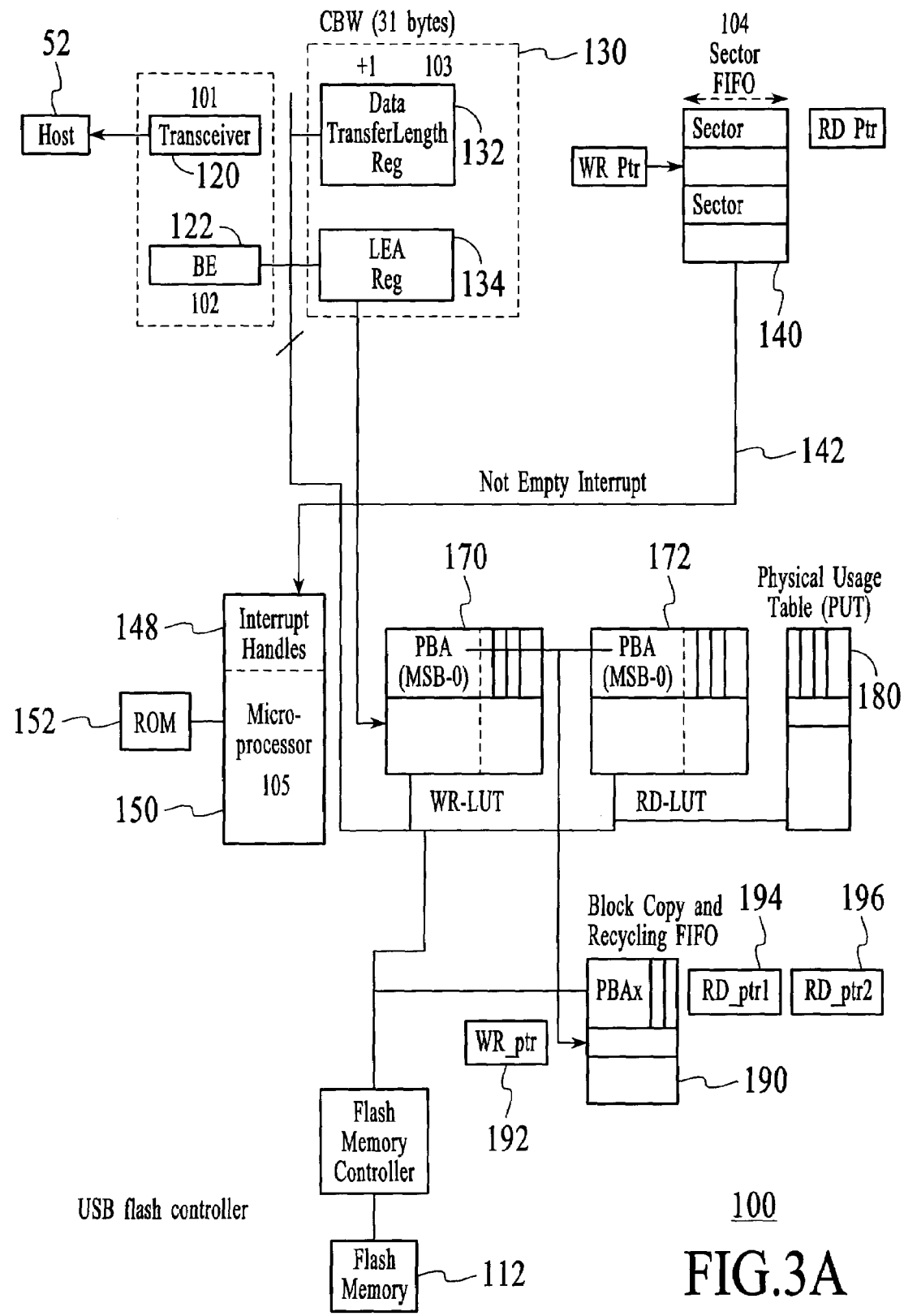
FIG. 3A is a block diagram of a flash memory system including a flash memory controller and a flash memory in accordance with the present invention.

FIG. 3A is a block diagram of a flash memory system 100 in accordance with the present invention. Additional embodiments of the flash memory system 100 is described in a co-pending U.S. application Ser. No. 10/789,333, filed on Mar. 10, 2004, and entitled "System and Method for Controlling Flash Memory," and is herein incorporated by reference.

The flash memory system 100 is adapted to couple to a host system 52. In this specific embodiment, the host system 52 is a USB host system. The host system 52 can be any personal computer or any other type of computer system. The operating system of the host system 52 can be Windows or MacOS but is not limited to these operating systems. In this specific embodiment, the flash memory system 100 complies with the USB mass-storage class standard. The USB specification can be revision 1.1 or 2.0 and above. The flash memory system 100 can be used as a mass storage device. The advantage of being used as a mass storage device is that it is a low-power device, it is easy to carry, and it has storage capacity larger than a traditional floppy disk.

The flash memory system 100 includes a USB interface to the host system 52, where the USB interface comprises a device transceiver 120 and a serial interface engine (SIE) 122. The transceiver 120 converts analog signals to digital streams and includes a phase lock loop (PLL) circuit for generating a precision clock for latching serially received data. For USB 2.0, the PLL functionality can be sensitive and thus useful due to its operating at 480 MHz. The SIE 122 provides serial and parallel data conversion, packet decoding/generation, cyclic redundancy code (CRC) generation/checking, non-return-to-zero (NRZI) encoding/decoding, and bit stuffing. A USB serial standard is implemented in this block.

A bulk-only transport (BOT) unit 130 receives command block wrappers (CBW) (typically 31 bytes), which includes command decoding/direction. The CBW is also the source for a sector transfer length register 132 and a logical block address (LBA) register 134.

A sector first-in-first-out (FIFO) 140 provides data buffering. During a write operation, a FIFO-not-empty interrupt signal 142 triggers a microprocessor interrupt routine at an interrupt handler 148 of a processor 150. The interrupt routine informs the host system 52 that data has been successfully received. In the mean time, the processor 150 begins the writing process. When the microprocessor 150 knows that sector data has been correctly received, the microprocessor 150 responds back to the host 52 that the write is complete. In the mean time, the firmware executes the write process.

The processor 150 executes firmware stored in a read only memory (ROM) 152, responds to requests from the host system 52, and accesses the flash memory 112. In a specific embodiment, the processor 150 utilizes SCSI protocols to interface with the flash memory 112. While the specific type of processor will depend on the specific application, in a specific embodiment, the processor 150 is an 8-bit or a 16-bit processor.

A write look-up table (LUT) 170, a read LUT 172, and a physical usage table (PUT) 180 provide an index showing the mapping of the flash memory device 112. The write and read LUTs 170 and 172 facilitate write and read transactions, respectively, between the host system 52 and the flash memory device 112. The write and read LUTs 170 and 172 translate logical block addresses (LBAs) provided by the host system 52 to physical block addresses (PBAs) of the flash memory device 112. The PUT 180 performs physical sector mapping and provides a bitmap indicating programmed sectors, i.e., sectors to which data has already been written.

A recycling FIFO 190 recycles blocks of obsolete sectors so that they can be reprogrammed, i.e., written to with new data. The recycling FIFO 190 is used with one write pointer 192 and two read pointers 194 and 196 assigned for block-valid-sector copy and erase operations. The recycling operations are executed in the background, immediately after, and independently from write transactions to not interfere with the servicing of write transactions by the flash memory system 100.

For optimal ASIC implementation, the write and read LUTs 170 and 172, the PUT 180, and the recycling FIFO 190 are implemented with volatile static random access memory (SRAM). The flash memory device 112 can be implemented using one or more devices, each having one or more flash arrays.

Figure 3B:
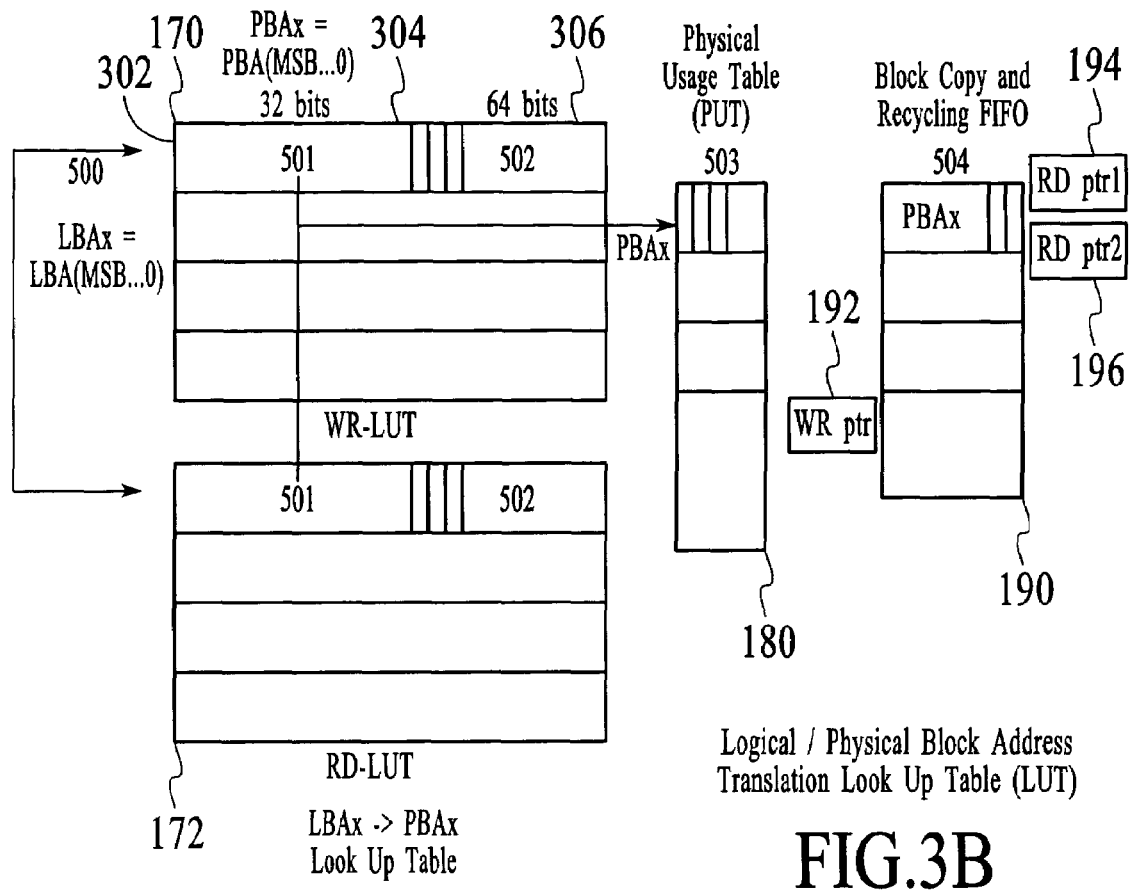
FIG. 3B is a block diagram showing in more detail the write look-up table, the read look-up table, the physical usage table, and the recycling first-in-first-out unit of FIG. 3A in accordance with the present invention.

FIG. 3B is a block diagram showing in more detail the write look-up table 170, the read look-up table 172, the physical usage table 180, the recycling first-in-first-out unit 190, and the write and read pointers 192, 194, and 196 of FIG. 3A in accordance with the present invention.

The write LUT 170 provides an index for the flash memory during write transactions and translates logical block addresses (LBAs) provided by the host system to PBAs of the flash memory. The write LUT 170 contains LBAs. For ease of illustration, only four LBAs per LUT are shown and only one LBA 302 is described. Each LBA 302 includes block-offset bits (bit5 to bit0). The block-offset bits correspond to a particular sector in a block.

Each LBA 302 is associated with a PBA 304. In this specific example, a PBA is 32-bits long. Also, each LBA is associated with a sector number field 306 typically having 64 more bits, which indicate with the sector data is valid or not.

The write LUT 170 records only the starting LBA for a particular write transaction. For example, if a particular write transaction requires two or more blocks, the write LUT 170 records the starting LBA.

The read LUT 172 provides an index for the flash memory during read transactions and translates LBAs provided by the host system to PBAs of the flash memory. The read LUT 172 is structured similarly to the write LUT 170 and has the same fields as the write LUT 170.

After the completion of each write transaction, the read LUT 172 is updated to reflect the changes to the write LUT 170 such that the write and read LUTs 170 and 172 become identical. Once the read LUT is updated, it can be used as an index for read transactions.

In operation, to maintain block address consistency, and achieve write efficiency, the write process is segregated into two phases. Once the exact addresses are calculated from the write LUT 170, the new data sectors are immediately written into the flash memory and a confirmation is returned to the firmware routine. If the next transaction is a read, the PBA from the read LUT 172 will be used to get the correct data stored in the flash memory, if the read address is different from the last write address. In the mean time, valid sector copy from the old block to the new block will be done in the background to maintain data coherency.

The PUT 180 performs physical sector mapping and provides a bitmap indicating programmed sectors, i.e., sectors to which data has already been written. Whenever a write transaction occurs, the PUT 180 records the usage information indicating the programmed sectors. This facilitates write transactions in that the processor of the flash memory controller can determine from the PUT 180 which sectors are available for programming or reprogramming. A bit map of the PUT 180 is a recording of all sectors used.

A recycling FIFO 190 recycles blocks of obsolete and redundant sectors and the recycling process occurs after each successful write transaction. Whenever a block having an obsolete or redundant sector is encountered, information regarding that block is placed in the recycling FIFO 190. Such information indicates which sectors are obsolete and which sectors are redundant. The recycling FIFO 190 performs valid-sector copy and non-valid block erase operations. Non-valid blocks are blocks that contain obsolete or redundant sectors. The recycling FIFO 190 uses a write pointer 192 and read pointers 194 and 196. The copy and erase operations are performed in the background, i.e., independently from write transactions to not interfere with the write transactions.

Each time a write transaction occurs, the obsolete block is placed into the Recycling FIFO. The write pointer 192 is incremented and the recycling FIFO not-empty flag becomes "1." The copying process begins when the normal write process is finished. The erasing and recycling process begin when all the necessary copying is finished.

Flash Memory Assembly

Figure 4A:
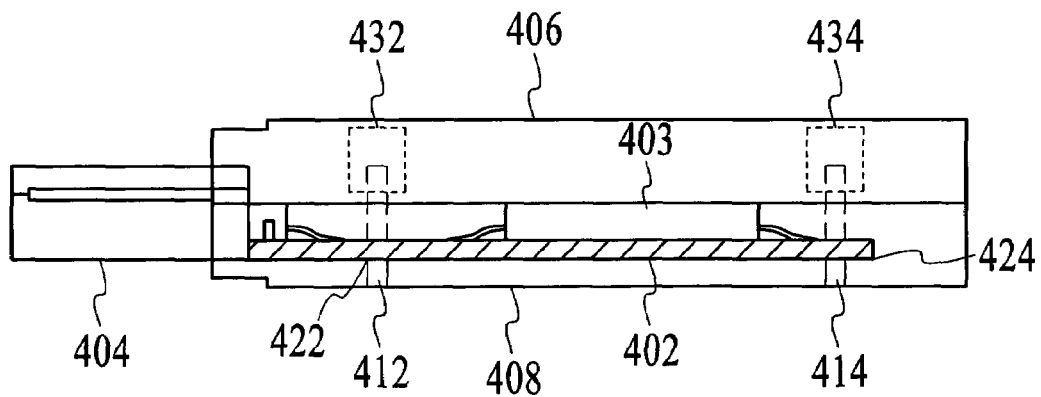
FIGS. 4A and 4B are side-view and exploded perspective-view diagrams of a conventional flash memory assembly, which can be used to implement the flash memory controller of FIG. 2.
Figure 4B:
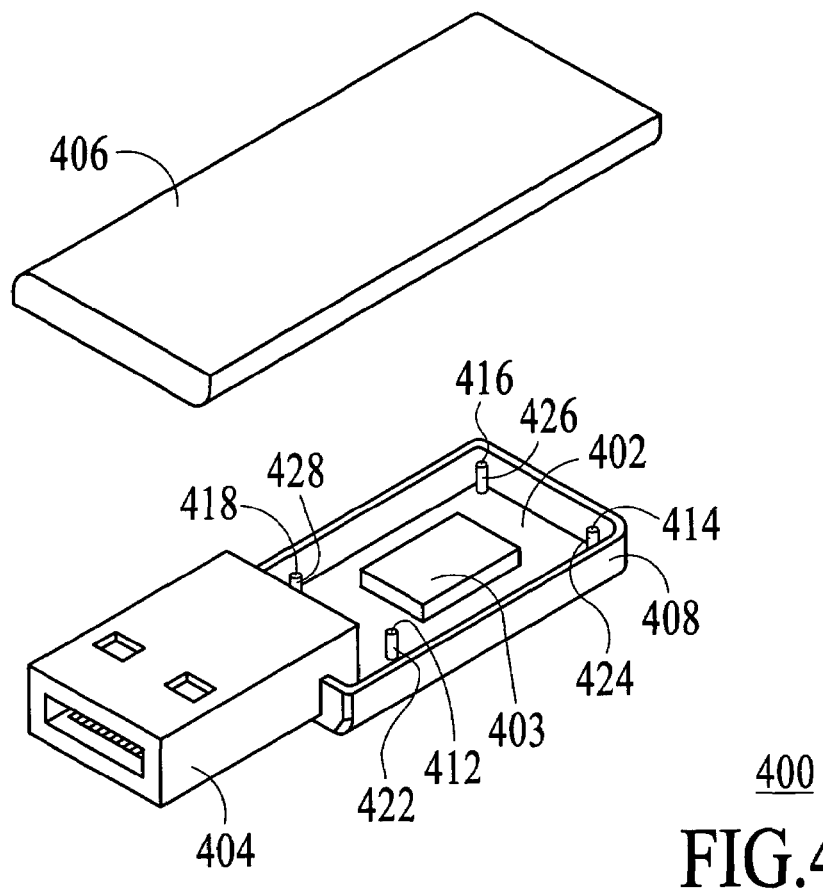
Figure 4C:
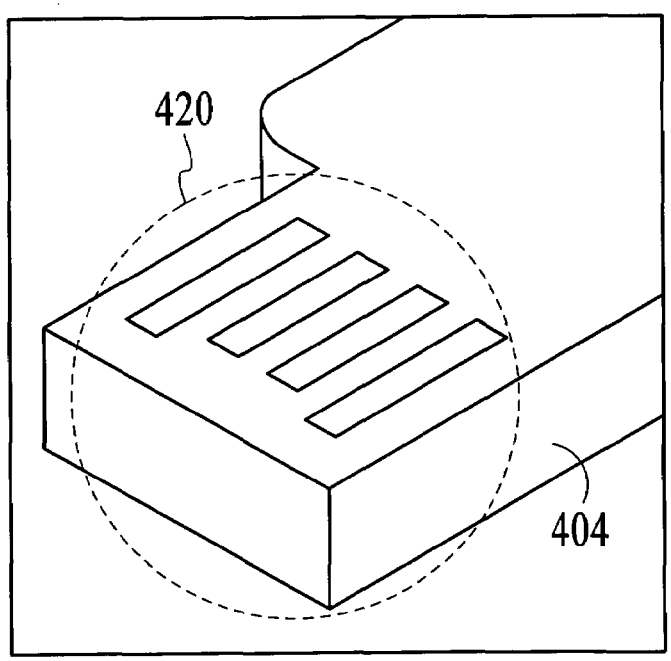
FIG. 4C is a blow-up perspective-view diagram of the USB connector of FIGS. 4A-4B.

FIGS. 4A-4C are diagrams of a flash memory assembly 400, which can be used to implement the flash memory controller 110 of FIG. 2. FIG. 4A is a side-view diagram of the flash memory assembly 400. The flash memory assembly 400 comprises a printed circuit board (PCB) 402, a flash memory device 403, a universal serial bus (USB) connector 404, a top cover 406, and a bottom cover 408. The flash memory device 403 and USB connector 404 are typically soldered to the PCB 402. The flash memory device 403 represents a flash memory system, which includes flash memory components such as a flash memory controller, a flash memory array, etc. While the flash memory components of the flash memory system can be distinct separate devices, the flash memory system is represented as the flash device 403 for ease of illustration.

FIG. 4B is an exploded perspective-view diagram of the flash memory assembly 400 of FIG. 4A in accordance with the present invention. Referring to FIGS. 4A and 4B together, the PCB assembly 420 includes the combination of the PCB 402, the flash memory device 403, and the USB connector 404. In other words, the PCB assembly 420 is the flash memory assembly 400 without covers. FIG. 4A illustrates the "unbalanced" nature of the flash memory assembly 400. As shown, the PCB 402 attaches to one side (lower portion) of the USB connector 404, hence the term "unbalanced."

The flash memory assembly 400 includes alignment pins 412, 414, 416, and 418, which help in aligning and engaging the bottom cover 408, the PCB 402, and the top cover 406. Alignment holes 422, 424, 426, and 428 reside at least partially inside the perimeter of the PCB 402 to allow the alignment pins 412-418 to penetrate through. The alignment pins 412-418 are integrated in the bottom cover 408 and are received in alignment receptacles, which are integrated in the top cover 406. Alignment receptacles 432 and 434 (FIG. 4A) receive the alignment pins 412 and 414, respectively. Alignment receptacles, which receive Is the alignment pins 416 and 418 also present but are hidden from view. The combination of the alignment pins, holes, and receptacles provide a secure coupling for the components of the flash memory assembly 400. The pins 412-418 can alternatively be integrated into the top cover 406, and the corresponding receptacles can be integrated into the bottom cover 408.

FIG. 4C is a blow-up perspective-view diagram of the USB connector 404 of FIGS. 4A-4B, where USB connector pins 420 are exposed.

Figure 5:
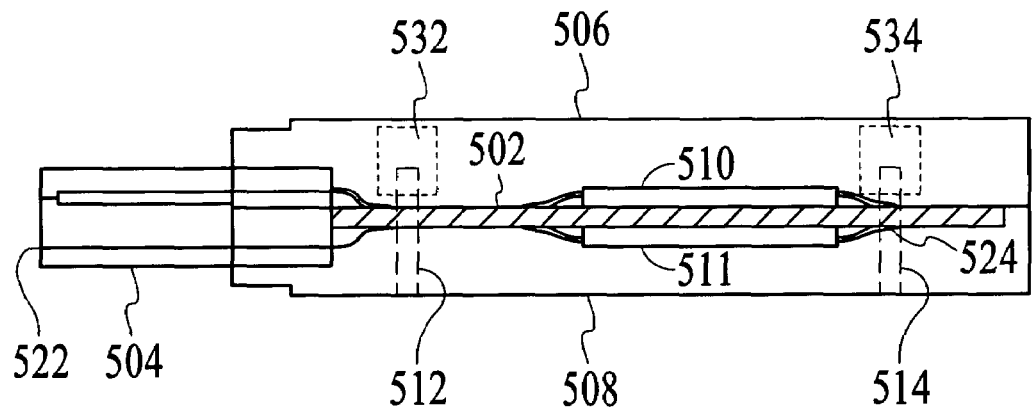
FIG. 5 is a side-view diagram of a flash memory assembly in accordance with another embodiment of the present invention.

FIG. 5 is a side-view diagram of a flash memory assembly 500 in accordance with another embodiment of the present invention. The flash memory assembly 500 includes a PCB 502, a USB connector 504, a top cover 506, a bottom cover 508, and flash memory components 510 and 511. An engagement mechanism comprising alignment pins 512 and 514 helps in assembly alignment and engagement of the bottom cover 508, the PCB 502, and the top cover 506. Alignment holes 522 and 524 reside at least partially inside the perimeter of the PCB 502 to allow the alignment pins 512 and 514 to penetrate through. The alignment pins 512 and 514 are integrated in the bottom cover 508 and are respectively received in alignment receptacles 532 and 534, which are integrated in the top cover 506. Two additional alignment pins (configured similarly to the alignment pins 416 and 418 of FIG. 4B) and corresponding alignment holes and alignment receptacles are also present but are hidden from view. The combination of the alignment pins, holes, and receptacles provide a secure coupling for the components of the flash memory assembly 500. Similar to what has been previously described, the alignment pins can be integrated into the top cover, while the corresponding receptacles can be integrated into the bottom cover.

The centerline in the thickness direction of the PCB 502 attaches substantially symmetrically to the middle portion of the USB connector 504, hence the term "balanced." A benefit the balanced positioning of the PCB 502 relative to the USB connector 504 is that it can accommodate flash memory components on both sides of the PCB 502 without having to modify the same and/or size of the covers. As shown, the flash memory component 510 is situated on the top side of the PCB 502 and the flash memory component 511 is situated on the bottom side of the PCB 502. As such, the flash memory assembly 500 can have a higher memory capacity than can similarly-dimensioned conventional flash memory assemblies, which have flash memory components only on the top side of the PCB. Since the flash memory assembly 500 has a balanced configuration, it can accommodate more flash memory components, hence achieve increased memory capacity, without having to increase the physical size of the assembly.

Figure 6:
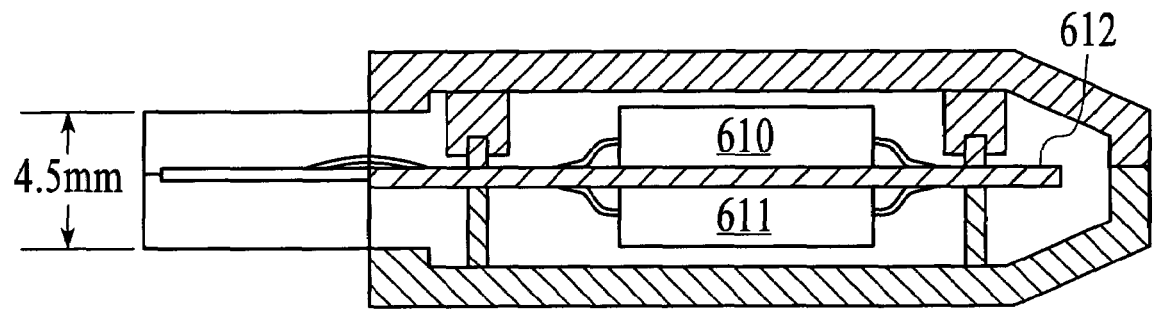
FIG. 6 is a side-view diagram of a balanced flash memory assembly in accordance with the present invention.
Figure 7:
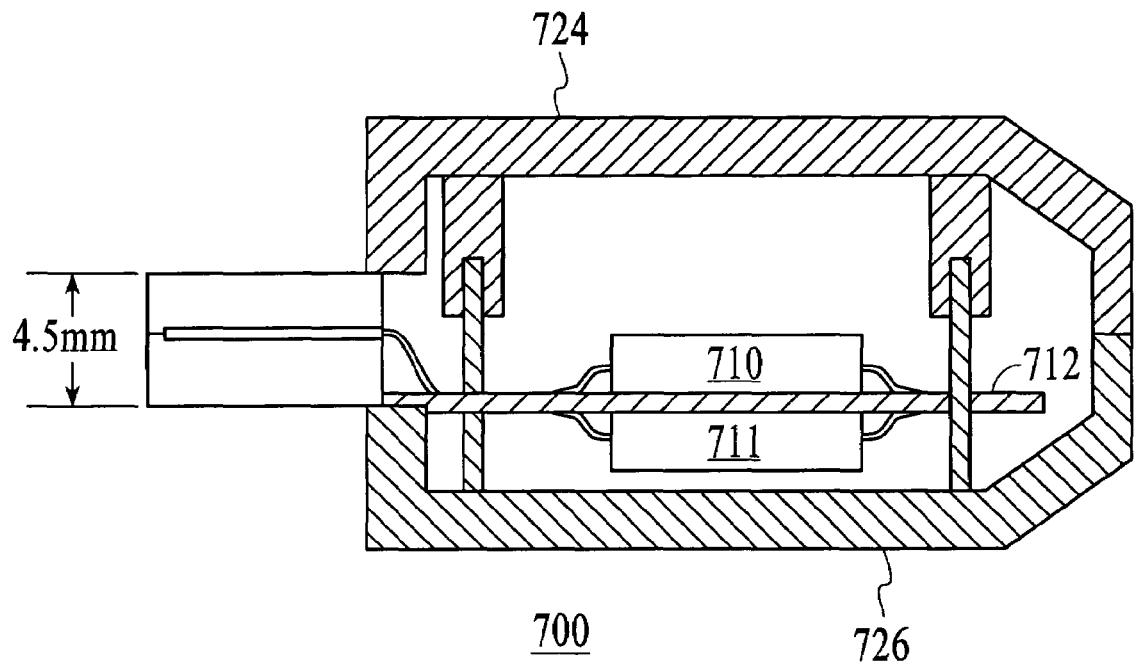
FIG. 7 is side-view diagram of an unbalanced flash memory assembly.
Figure 8:
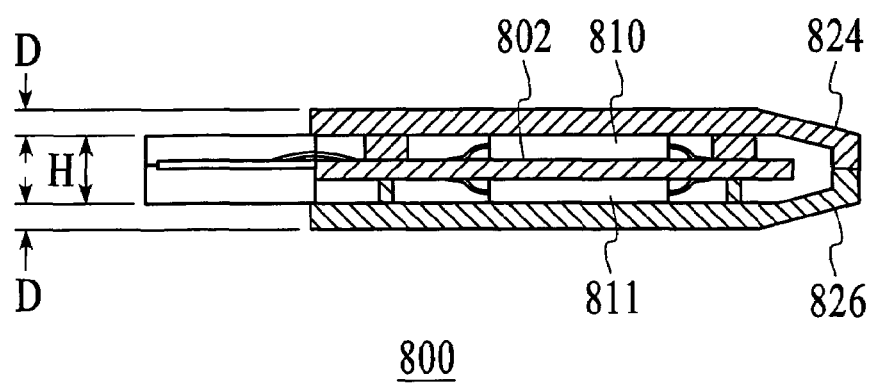
FIG. 8 is a side-view diagram showing a balanced flash memory assembly in accordance with another embodiment the present invention.

FIGS. 6-8 compare the balanced configuration with the unbalanced configuration. FIG. 6 is a side-view diagram of a balanced flash memory assembly 600 in accordance with the present invention. FIG. 7 is a side-view diagram of an unbalanced flash memory assembly 700 representing a conventional design. Referring to both FIGS. 6 and 7 together, the balanced flash memory assembly 600 can accommodate flash memory components 610 and 611 on both sides of the PCB 612 without a significance increase, if any, in cover size (thickness). The unbalanced flash memory assembly 700 can also accommodate the flash memory components 710 and 711 on both sides of the PCB 712. However, the thickness of the USB housing (i.e., top cover 724 and bottom cover 726) needs to be increased substantially to accommodate flash memory components 710 and 711. In these specific embodiments, thin small outline packages (TSOPs) (about 1.1 mm thick) or very thin small outline packages (WSOPs) (about 0.7 mm thick) can be used to implement the flash memory components 610, 611, 710, and 711. For both flash memory assemblies 600 and 700, the height of the USB connector is 4.5 mm, which is standard. The actual size of the top and bottom covers will depend on the size of the flash memory components used and the configuration (balanced or unbalanced) chosen.

As can be seen when comparing the balanced flash memory assembly 600 to the unbalanced flash memory assembly 700, the usage of space with the balanced configuration is optimized, which allows for the overall size to be optimize. Whereas with the unbalanced configuration, a significant portion of the space between the upper surface of PCB 712 and inner surface of the top cover 724 is wasted as the housing needs to grow taller to accommodate the memory devices. This is important because USB ports are typically stacked with one USB port place just above the other. The bigger unbalanced flash memory assembly 700, when plugged into a USB port, may block an adjacent USB port. This would not be a problem with the balanced flash memory assembly configuration.

FIG. 8 is a side-view diagram showing a balanced flash memory assembly 800 in accordance with another embodiment the present invention. The flash memory assembly 800 is made even thinner than the flash memory assembly 600 of FIG. 6. This is achieved by eliminating the space between the upper surface of the flash memory component 810 and the inner surface of the top cover 824, and by eliminating the space between the flash memory component 811 and inner surface of the bottom cover 826. As can be seen, the balanced flash memory assembly 800 is significantly thinner than the unbalanced flash memory assembly 700 of FIG. 7, while maintaining accommodating the same number of flash memory components.

The minimal thickness of the USB housing will be (H+2D), where H is the thickness of the USB plug connector, and D is the thickness of the housing. The thickness H is 4.5 mm as indicated in FIG. 7, and this amount is larger than the combined thickness of about 2.7 mm which includes PCB 802 (about 0.5 mm) and two flash memory components 810 and 811 mounted on both sides of PCB, such as thin small outline packages (TSOPs) (about 1.1 mm). Compared with the conventional unbalanced flash memory assembly 700 of FIG. 7, the balanced flash memory component 800 accommodates the same amount flash memory components but with substantially thinner housing by at least twice the height of a flash memory component 810 or 811. The smaller height value of (H+2D) for a balanced USB flash memory assembly enables the receptacles (not shown) of an USB host to be spaced closer than for the cases of unbalanced USB flash memory assemblies. The center-to-center distance between the stacked USB hosts can be designed to be as small as (H+2D), plus the clearance between the two neighboring USB flash memory assemblies.

The following figures illustrate the alignment mechanisms described above and additional features for aligning and engaging the components of a flash memory assembly in accordance with the present invention.

Figure 9:
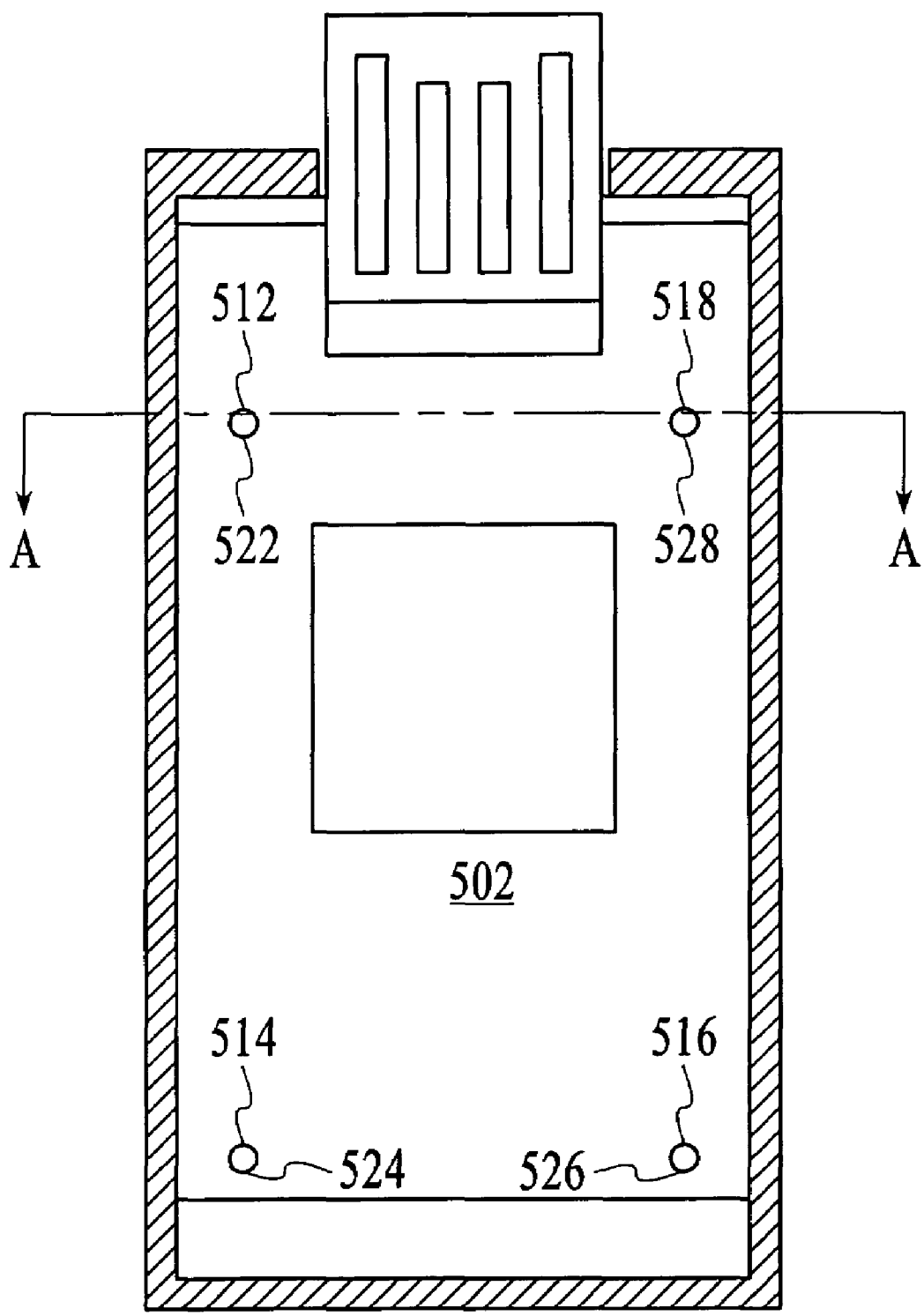
FIG. 9 is a top-view diagram of the flash memory assembly of FIG. 5A in accordance the present invention.

FIG. 9 is a top-view diagram of the flash memory assembly 500 of FIG. 5A in accordance the present invention. The flash memory assembly 500 includes alignment holes 522, 524, 526, and 528 through which alignment pins 512, 514, 516, and 518 protrude. The alignment pins 512-518, which extend from the bottom cover 508, are concentric with the alignment holes 522-528, respectively, to penetrate through the PCB 502. As shown, the alignment holes 512, 514, 516, and 518 reside completely inside the perimeter of the PCB 502.

Figure 10:
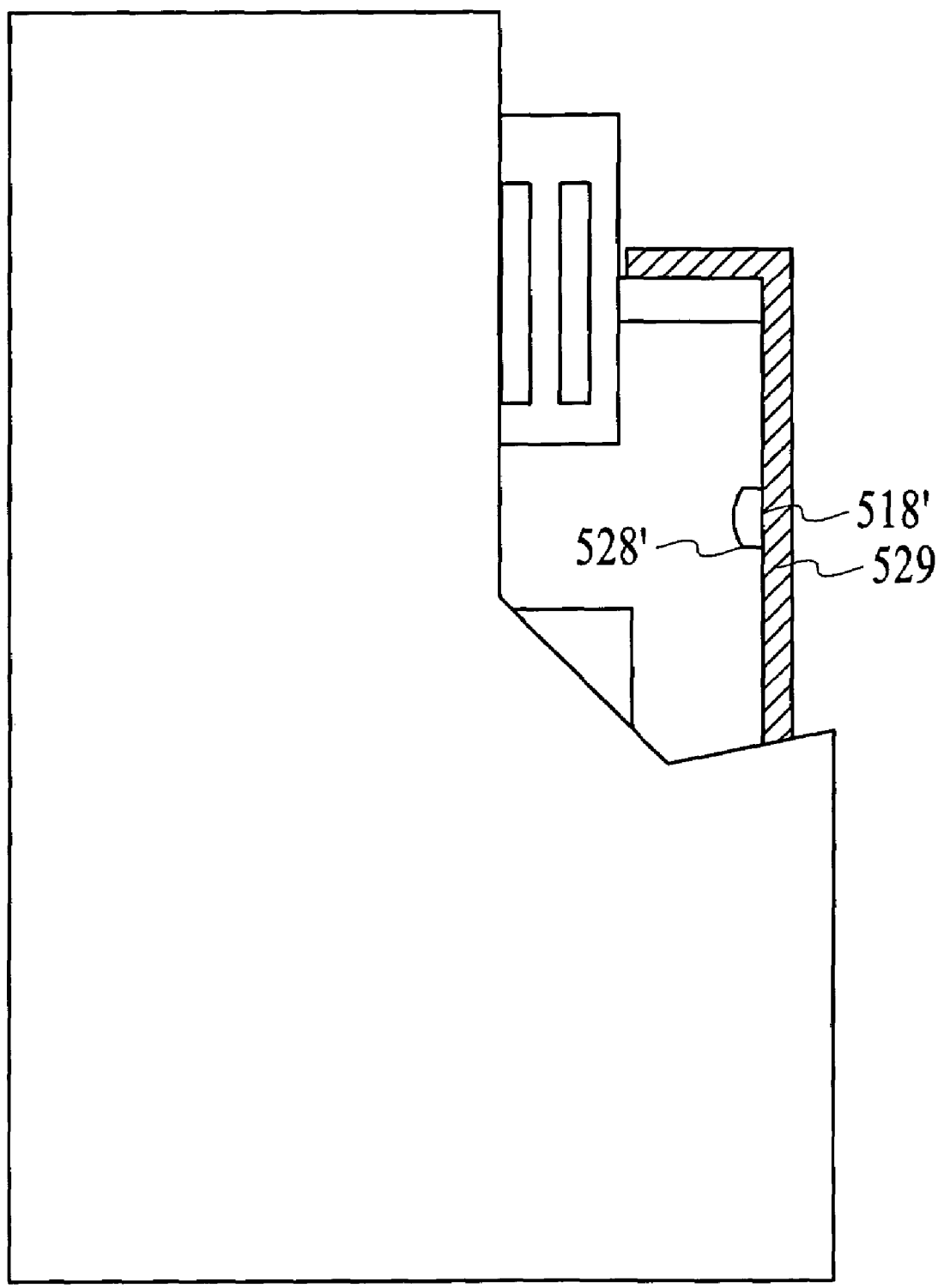
FIG. 10 is a partial top-view diagram illustrating an alignment notch, which can be used in lieu of an alignment hole in accordance with another embodiment of the present invention.

Alternatively, the pin and hole locations can be moved outward to be coincident with the edge of the PCB 502. As such, the alignment holes can be referred to as alignment notches. FIG. 10 is a partial top-view diagram illustrating an alignment notch 528', which can be used in lieu of the alignment hole 528 in accordance with another embodiment of the present invention. As shown, the alignment notch 528' resides on the edge of the perimeter of the PCB 502, allowing the alignment pin 518' to penetrate through. Alternatively, the alignment pin 518' can be integrated to a sidewall 529.

Although the present invention has been described in accordance with the embodiments shown, one of ordinary skill in the art will readily recognize that there could be variations to the embodiments, and that those variations would be within the spirit and scope of the present invention. For example, the alignment pins can be integrated in the top cover and the alignment receptacles can be integrated in the bottom cover. Accordingly, many modifications may be made by one of ordinary skill in the art without departing from the spirit and scope of the appended claims.

Additional assembly mechanisms and methods are described below in FIGS. 11-24. These mechanisms and methods can be applied to add additional integrity to a flash memory assembly. Additionally, these mechanisms and methods can be used in addition to or in lieu of the alignment mechanisms described above to provide integrity to the flash memory assembly.

Figure 11:
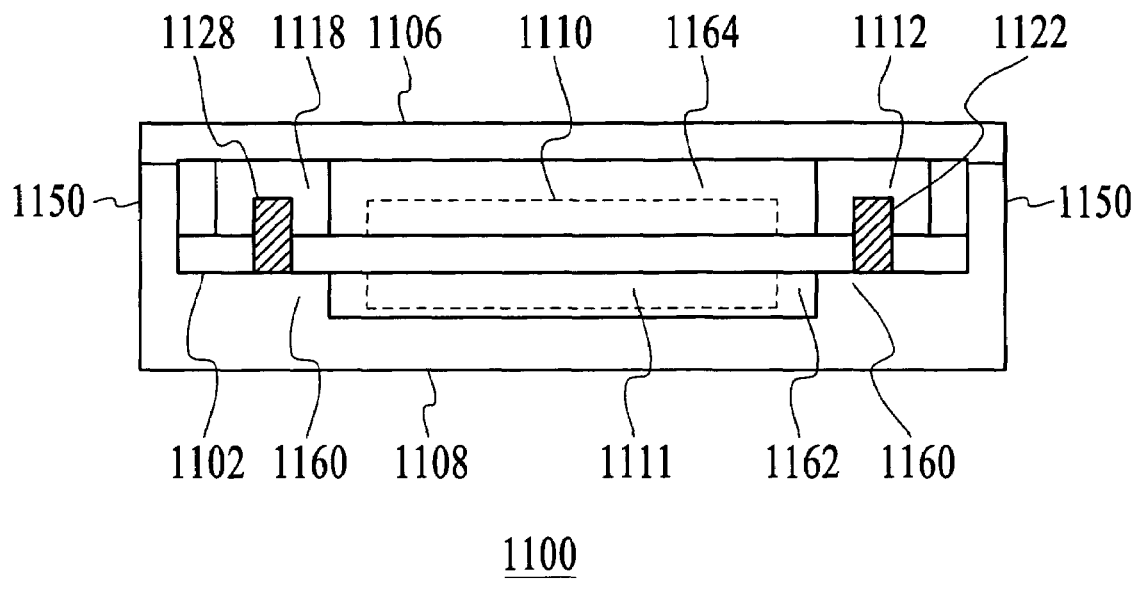
FIG. 11 is a front-view diagram of a balanced flash memory assembly in accordance with the present invention.

FIG. 11 is a front-view diagram of a balanced flash memory assembly 1100 in accordance with the present invention. The flash memory assembly 1100 includes a PCB 1102 housed within a top cover 1106 and a bottom cover 1108. A flash memory component 1110 is mounted on the top of the PCB 1102, and a flash memory component 1111 is mounted on the bottom of the PCB 1102. Alignment receptacles 1112 and 1118 are adapted to receive alignment pins 1122 and 1128, respectively. Two additional alignment receptacle-pin pairings are also present but are hidden from view. These alignment receptacles and pins provide support for the PCB 1102 in addition to providing support for the top and bottom covers 1106 and 1108.

To provide further support for the PCB 1102, the bottom cover 1108 has an extrusion 1150 and a seat 1160. The Extrusion 1150 is the vertical wall integrated into the bottom cover 1108 and extends around and against the majority of the perimeter of the PCB 1102, providing lateral support for the PCB 1102. The seat 1160 extends from the base of the extrusion 1150 and expands laterally toward the center of a cavity 1162 to provide horizontal support for the PCB 1102. The PCB 1102 is placed against the extrusion 1150 and on top of the seat 1160. The extrusion 1150 and the seat 1160, and variations thereof, can be applied to other embodiments of the present invention described herein.

The height of the seat 1160 is designed so that it is at least the same as the maximum height of the flash memory component 1111. The cavity 1162, which is formed by the PCB 1102, the bottom cover 1108, and the seat 1160, protects the flash memory component 1111 as it is mounted to the bottom surface of PCB 1102. A similar pocket space is created in the top cover 1106 to provide a cavity 1164 for the flash memory device 1110 on the top side of PCB 1102.

Various materials for the covers can be used and the specific material used will depend on the manufacturing and assembly method, and the specific application. The features described above, used to align and support PCB, can be applied to all the manufacturing procedures disclosed herein. In addition, each manufacturing method may have its own features to align and support PCB and top and bottom covers to supplement the aforementioned features.

FIGS. 12-17 describe embodiments for joining a top cover with a bottom cover in a flash memory assembly in accordance with the present invention. The embodiments described below are the same for both the balanced and unbalanced flash memory assemblies, except that the support seats for the PCB, if implemented, will vary in height.

Figure 12:
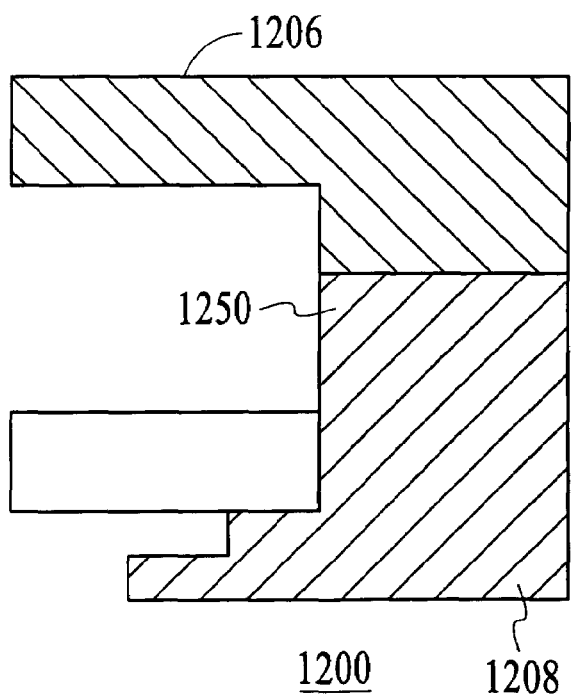
FIG. 12 is a partial front-view diagram a flash memory assembly illustrating an interface between a top cover and a bottom cover in accordance with another embodiment of the present invention.

FIG. 12 is a partial front-view diagram a flash memory assembly 1200 illustrating an interface between a top cover 1206 and a bottom cover 1208 in accordance with another embodiment of the present invention. The bottom cover 1208 includes an extrusion 1250 that has a flat top surface. As such, the interface between the bottom edge of the top cover 1206 and the top edge of the bottom cover 1208 can be as simple as a flat surface.

Figure 13:
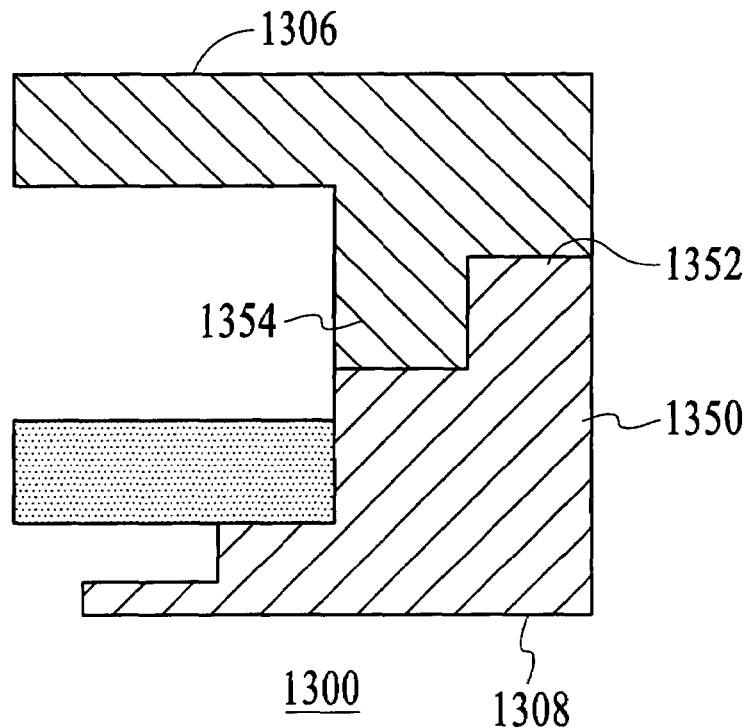
FIG. 13 is a partial front-view diagram a flash memory assembly illustrating an interface between a top cover and a bottom cover in accordance with another embodiment of the present invention.

FIG. 13 is a partial front-view diagram a flash memory assembly 1300 illustrating an interface between a top cover 1306 and a bottom cover 1308 in accordance with another embodiment of the present invention. The bottom cover has an extrusion 1350 that has a step 1352. A corresponding step 1354 is integrated into the top cover 1306. As such, the steps 1352 and 1354 provide an inter-locking type of alignment between the top and bottom covers 1306 and 1308.

Figure 14:
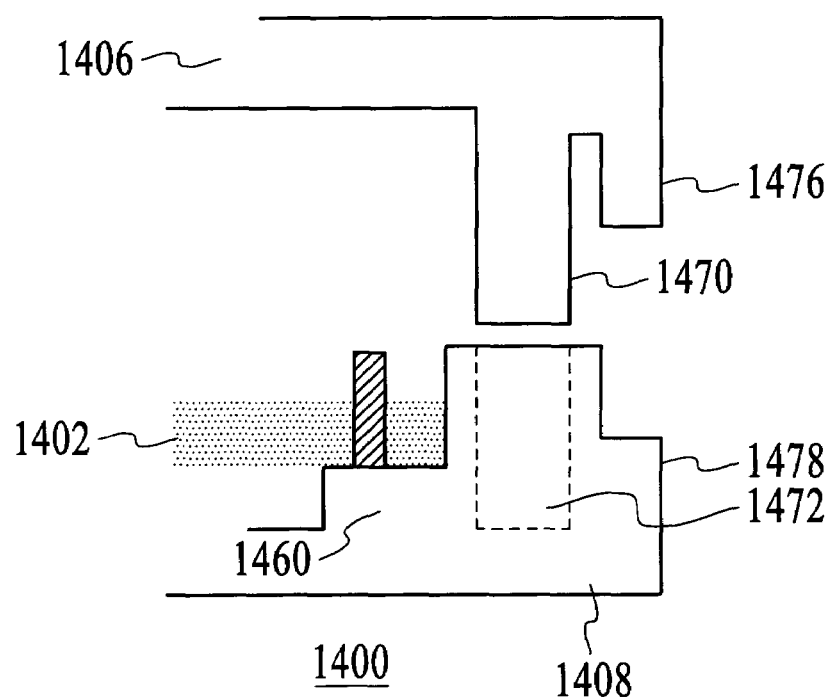
FIG. 14 is a partial front-view diagram of a flash memory assembly using a snap-together mechanism to join a top cover and a bottom cover in accordance with the present invention.

FIG. 14 is a partial front-view diagram of a flash memory assembly 1400 using a snap-together mechanism to join a top cover 1406 and a bottom cover 1408 in accordance with the present invention. The flash memory assembly 1400 includes a seat 1460 for supporting a PCB 1402, and includes an alignment pin 1470 and an alignment hole 1472. The top and bottom covers 1406 and 1408 align and engage using the alignment pin 1470 and the alignment hole 1472, which provide dimensional control. A plurality of such alignment pins and corresponding alignment holes are embodied in the cavity and along the perimeter of the top cover 1406. The dimension of the alignment pin 1470 is designed to be slightly larger than the dimension of the alignment hole 1472. Accordingly, the insertion of the alignment pin 1470 into the alignment hole 1472 is sufficiently tight as a press-fit to provide inter-locking between the top cover 1406 and the bottom cover 1408. The covers will be made of thermoplastic materials such as ABS, polycarbonate, or ABS/polycarbonate alloy.

An overhang 1476 is integrated into and wraps around the perimeter and along the bottom edge of the top cover 1406. The overhang 1476 is aligned with a corresponding step 1478, which is integrated into and wraps around the perimeter and along outside edge of the bottom cover 1408. The dimensions of the overhang 1476 and the step 1478 are controlled such that a press fit is formed when the top cover 1406 engages the bottom cover 1408, and when overhang 1476 and the step 1478 are pressed against each other. The location of a vertical surface of the step 1478 stops the downward movement of the top cover 1406 as the overhang 1476 rests on the step 1478. As shown, the top cover 1406 and the bottom cover 1408 can be snapped together using appropriate dimensional control at the interface between the top and bottom covers 1406 and 1408.

One of ordinary skill in the art will readily recognize that there could be variations to the embodiments disclosed herein, and that those variations would be within the spirit and scope of the present invention. For example, the overhang 1476 can be a plurality of overhangs positioned around the perimeter of the top cover 1406. Similarly, the step 1478 can be a plurality of steps positioned around the perimeter of the bottom cover 1408. Both the balanced and unbalanced types of flash memory assemblies can be assembled using this method. Furthermore, aspects of the present invention (e.g., the seat and extrusion supporting the PCB), even though not described in detail for every embodiment, can be applied to any and all embodiments of the present invention.

Figure 15:
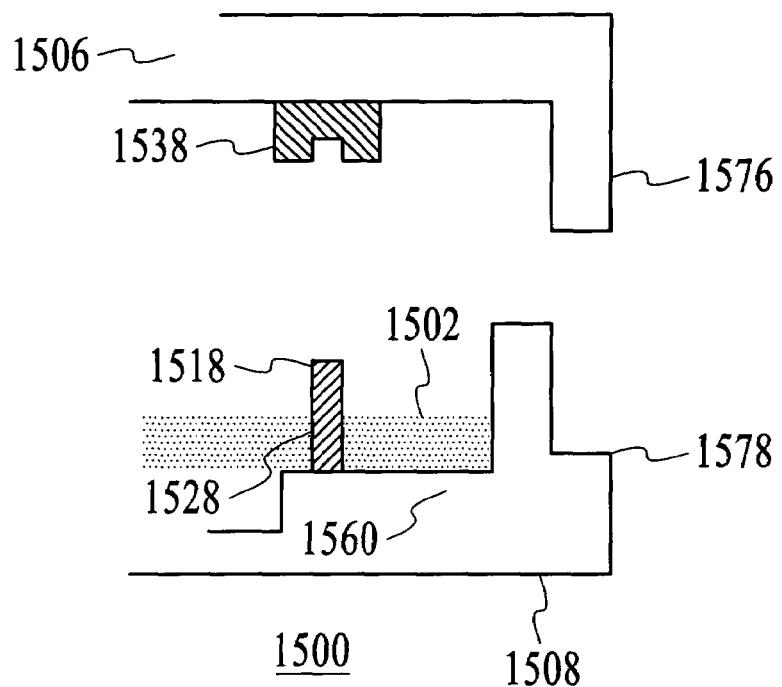
FIG. 15 is a partial front-view diagram of a flash memory assembly using a snap-together mechanism to join a top cover and a bottom cover in accordance with another embodiment of the present invention.

FIG. 15 is a partial front-view diagram of a flash memory assembly 1500 using a snap-together mechanism to join a top cover 1506 and a bottom cover 1508 in accordance with another embodiment of the present invention. The flash memory assembly 1500 includes a seat 1560 for supporting a PCB 1502, an alignment pin 1518, an alignment hole 1528 in a PCB 1502, and an alignment receptacle 1538. The top and bottom covers 1506 and 1508 align and engage using the alignment pin 1518, the alignment hole 1528, and the alignment receptacle 1538. This configuration eliminates the need for an alignment pin such as the alignment pin 1470 of FIG. 14 thus enabling a thin-walled cover design. The flash memory assembly of FIG. 15 includes an overhang 1576 and a corresponding step 1578, which function similarly to those of FIG. 15. The snapping between overhang 1576 and the step 1578 provides a seal between the top cover 1506 and the bottom cover 1508. The step 1578 can be thinner that the step 1478 of FIG. 14 because the step 1578 does not have an alignment hole 1572.

Figure 16:
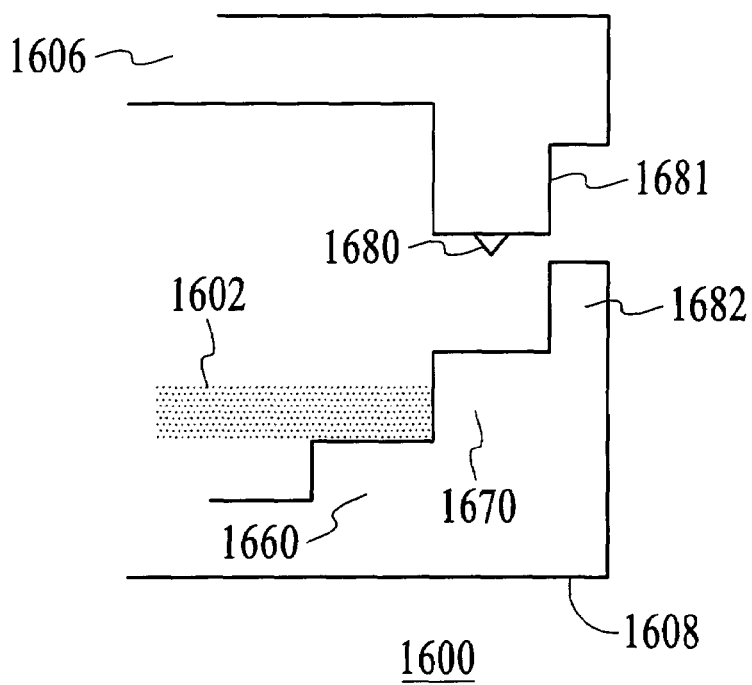
FIG. 16 is a partial front-view diagram of a flash memory assembly using ultrasonic joining to join a top cover and a bottom cover in accordance with the present invention.

FIG. 16 is a partial front-view diagram of a flash memory assembly 1600 using ultrasonic joining to join a top cover 1606 and a bottom cover 1608 in accordance with the present invention. The flash memory assembly 1600 includes a seat 1660 for supporting a PCB 1602 and a vertical wall 1670 for aligning PCB with the cavity inside the bottom cover 1608. To be joined by an ultrasonic welding process, the top and bottom covers 1606 and 1608 can be made of thermoplastic materials such as ABS, ABS/polycarbonate alloy, polyester, PVC, Nylon and Nylon with fiberglass. A PCB 1602 is placed between the top cover 1606 and the bottom cover 1608. A plurality of ultrasonic bonders 1680, which protrude from a flat edge of the sidewall 1681 of the top cover 1606, serves as the initial melting point as an ultrasonic wave from the ultrasonic welding machine generates high frequency vibration between the ultrasonic bonder 1680 and the bottom cover 1608.

The bottom cover 1608 includes a guard 1682 that prevents melting plastic from the bonder 1680 to flow toward the exterior surface of the flash memory assembly 1600. Instead, the melting plastic to flow toward the inside of the USB assembly 1600, thus creating a final product with an attractive surface finish. The guard 1682 also functions as an alignment step to enable quick assembly between the top and bottom covers 1606 and 1608.

Figure 17:
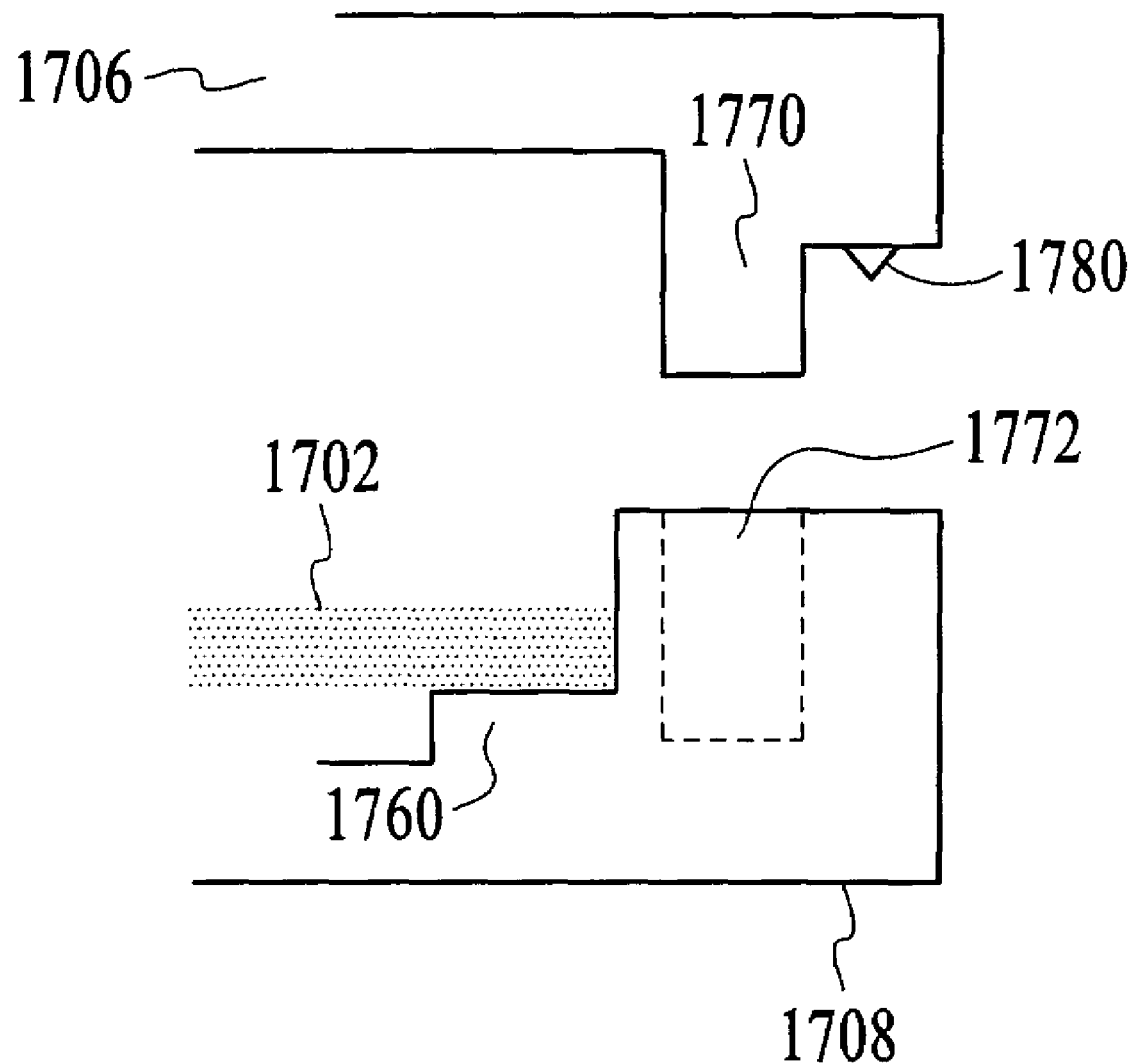
FIG. 17 is a partial front-view diagram of a flash memory assembly using ultrasonic joining to join a top cover and a bottom cover in accordance with another embodiment of the present invention.

FIG. 17 is a partial front-view diagram of a flash memory assembly 1700 using ultrasonic joining to join a top cover 1706 and a bottom cover 1708 in accordance with another embodiment of the present invention. The flash memory assembly 1700 includes a seat 1760 for supporting a PCB 1702, an alignment pin 1770, and an alignment hole 1772. The alignment pin 1770 and the alignment hole 1772 are loosely connected, which allows for quick alignment prior to the ultrasonic welding process. This is different from the snap-together method, which utilizes a tight coupling between the alignment pins and holes.

In an alternative embodiment, the alignment pin 1770 and the alignment hole 1772 can be eliminated, leaving a flat interface between the top and bottom covers 1706 and 1708. Alternatively, an alignment pin, an alignment hole in the PCB, and an alignment receptacle as described in FIG. 16 can also be used to provide alignment. As such, thinner-walled covers can be implemented.

Figure 18:
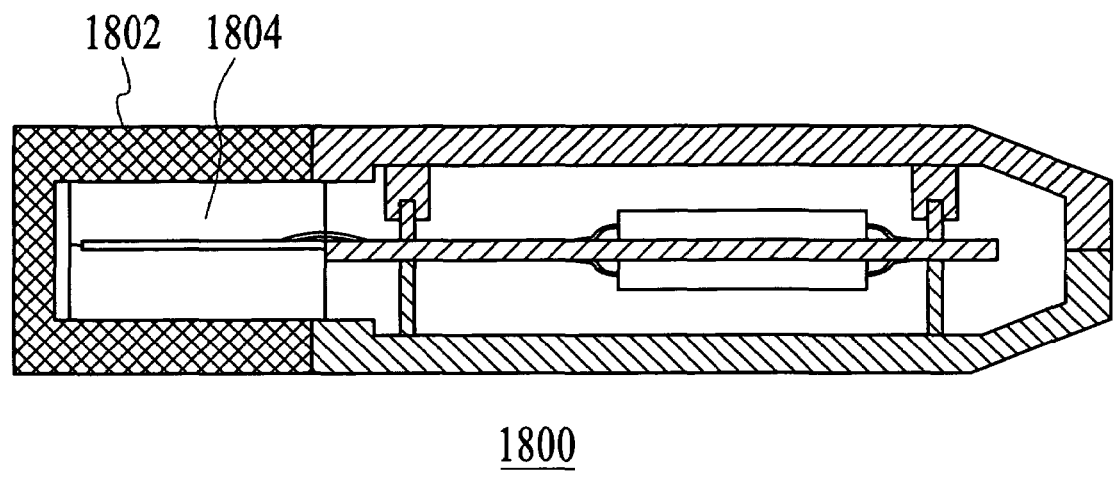
FIG. 18 is a side-view diagram of a flash memory assembly including a cap that protects a USB connector in accordance with the present invention.

FIGS. 18-24C are diagrams illustrating a cap that provides protection for USB connector of the flash memory assemblies described above. FIG. 18 is a side-view diagram of a flash memory assembly 1800 including a cap 1802 that protects a USB connector 1804 in accordance with the present invention. The cap 1802 slides over the USB connector 1804. The inside surface of the cap 1802 forms an interference fit with the outside surface of the USB connector 1804.

Figure 19:
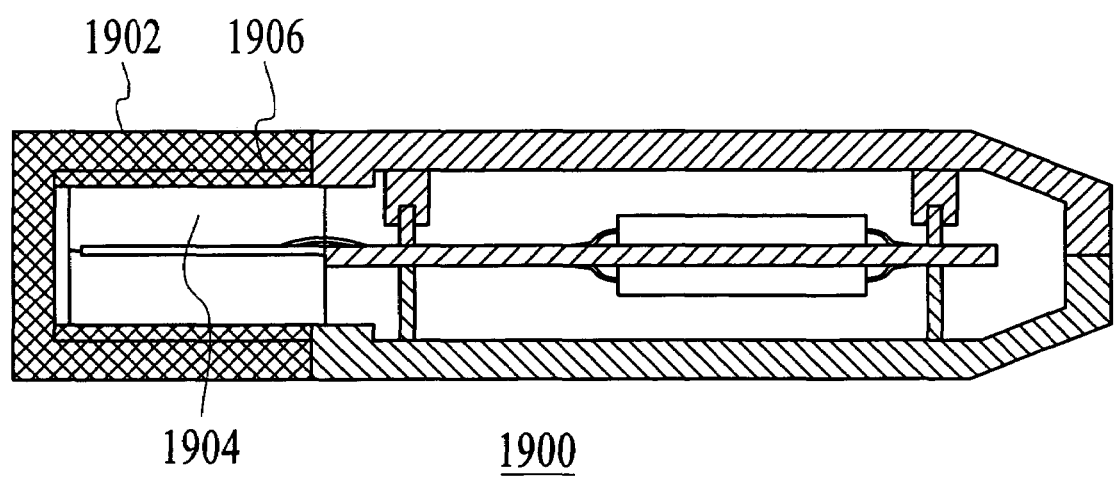
FIG. 19 is a side-view diagram of a flash memory assembly including a cap that protects a USB connector in accordance with another embodiment of the present invention.

FIG. 19 is a side-view diagram of a flash memory assembly 1900 including a cap 1902 that protects a USB connector 1904 in accordance with another embodiment of the present invention. The cap 1902 slides over the USB connector 1904. The cap 1902 is similar to the cap 1802 of FIG. 18, except that the inside surface of the cap 1902 has a plurality of ribs 1906, which form an interference fit with the outside surface of the USB connector 1904. In this specific embodiment, the ribs 1906 run generally in the longitudinal direction, and may run in other directions depending on the specific application.

Figure 20A:
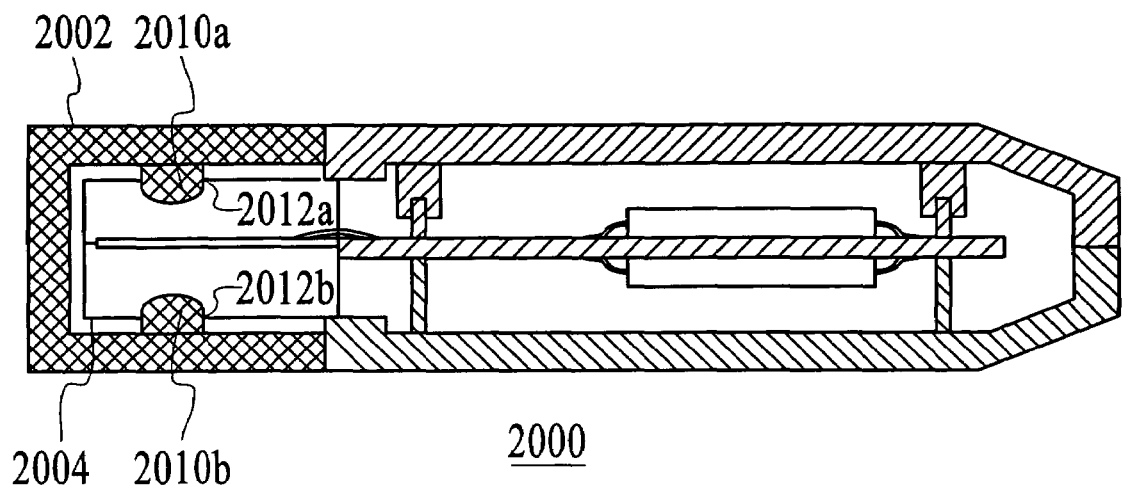
FIG. 20A is a side-view diagram of a flash memory assembly including a cap that protects a USB connector in accordance with another embodiment of the present invention.
Figure 20B:
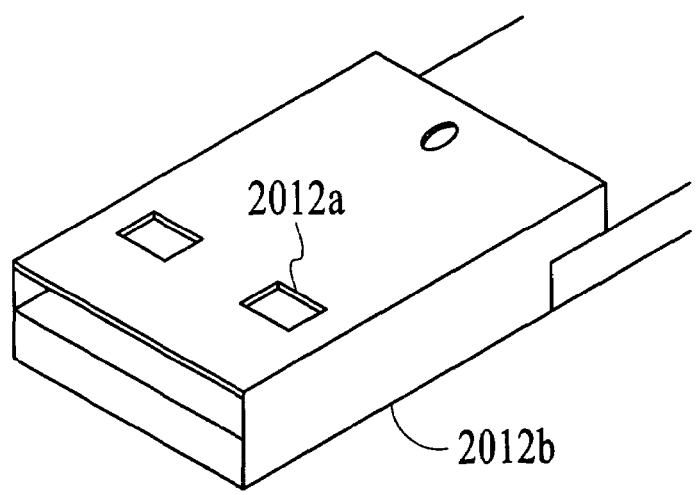
FIG. 20B is a perspective-view diagram of the USB connector of FIG. 30A in accordance with the present invention.

FIG. 20A is a side-view diagram of a flash memory assembly 2000 including a cap 2002 that protects a USB connector 2004 in accordance with another embodiment of the present invention. FIG. 20B is a perspective-view diagram of the USB connector 2004 of FIG. 20A in accordance with the present invention. Referring to both FIGS. 20A and 20B together, the cap 2002 slides over the USB connector 2004. The cap 2002 is similar to the cap 1902 of FIG. 19, except that the inside surface of the cap 2002 has protrusions 2010a and 2010b, which are inserted into holes 2012a and 2012b, respectively, when the cap 2002 slides over the USB connector 2004. The cap 2002 also has two other protrusions (hidden from view) adjacent to the protrusions 2010a and 2010b, which are inserted into corresponding holes, respectively, when the cap 2002 slides over the USB connector 2004. As a result, the interference fit between the inside surface of the cap 2002 and the USB connector ensures that the cap is properly closed, yet can be opened with an adequate amount of pulling force.

Figure 21:
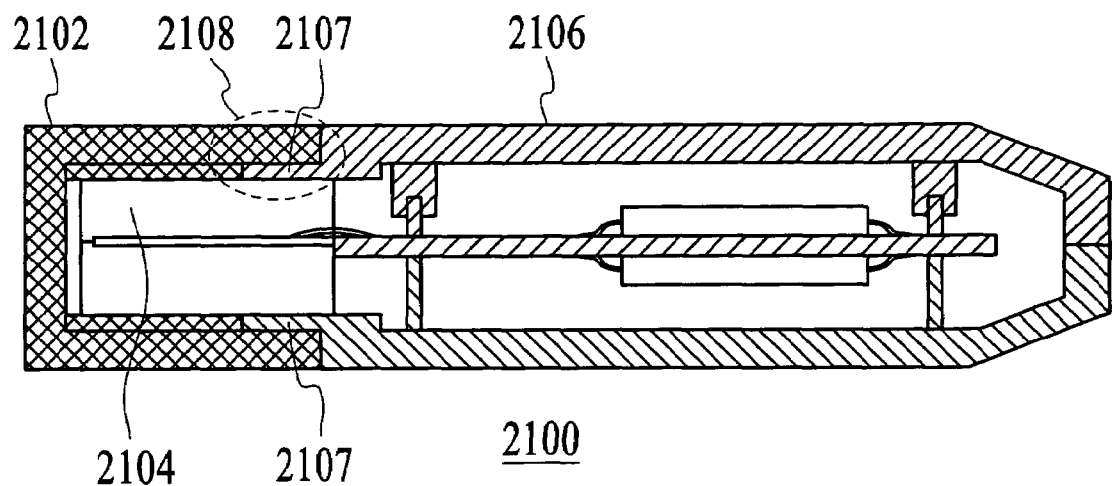
FIG. 21 is a side-view diagram of a flash memory assembly including a cap that protects a USB connector in accordance with another embodiment of the present invention.

FIG. 21 is a side-view diagram of a flash memory assembly 2100 including a cap 2102 that protects a USB connector 2104 in accordance with another embodiment of the present invention. As shown, the cap 2102 slides over the USB connector 2104 and partially over the housing 2106. The housing 2106 has a shelled portion 2107 that extends from its main body and wraps around the root section of the USB connector 2104. When the cap 2102 slides over the USB connector 2104, an interference fit is provided between the inside surface of the cap 2102 and the shelled portion 2107 of the housing 2106.

Figure 22:
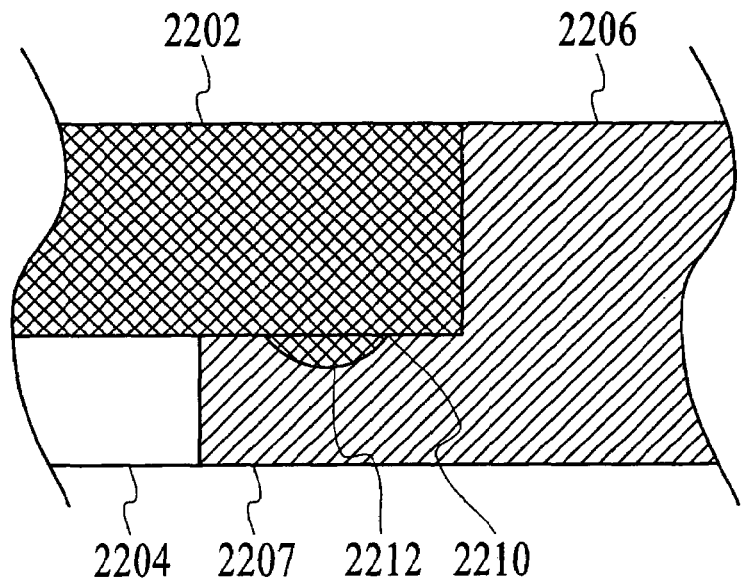
FIG. 22 is a partial side-view diagram of a flash memory assembly including a cap that protects a USB connector in accordance with another embodiment of the present invention.

FIG. 22 is a partial side-view diagram of a flash memory assembly 2200 including a cap 2202 that protects a USB connector 2204 in accordance with another embodiment of the present invention. The cap 2202 and the housing 2206 are similar to those of FIG. 21, where the cap 2202 slides over a shelled portion 2207 of the housing 2206. The difference is that the cap 2202 has a protrusion 2210, which is inserted into a recess 2212 in the shelled portion 2207 of the housing 2106. In this specific embodiment, the cap 2202 has a plurality of protrusions and corresponding recesses (hidden from view) like the protrusion 2210 and the recess 2212 positioned around the inside surface of the cap 2202. The specific number of protrusions and recesses can vary and will depend on the specific application. The protrusion 2210 and the recess 2212 provide an interference fit between the inside surface of the cap 2202 and the housing 2206.

Figure 23A:
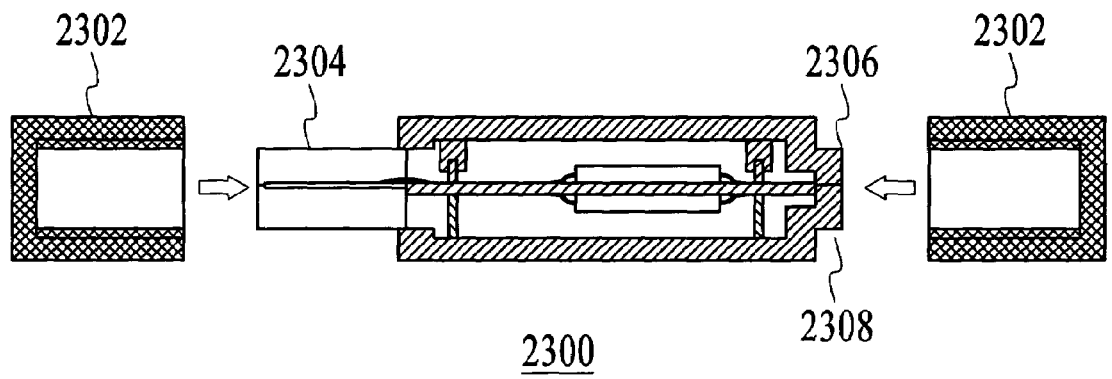
FIGS. 23A-C are side-view diagrams of a flash memory assembly including a cap that protects a USB connector in accordance with another embodiment of the present invention.

FIG. 23A is a side-view diagram of a flash memory assembly 2300 including a cap 2302 that protects a USB connector 2304 in accordance with another embodiment of the present invention. The cap 2302 can slide over the USB connector 2304 when the flash memory assembly is not in use. The cap 2302 can slide over the housing (i.e., over portions of the top cover 2306 and the bottom cover 2308) when the flash memory assembly 2300 is in use thereby providing a place to put the cap 2302 so that it does not get misplaced. As shown, portions of the top cover 2306 and the bottom cover 2308 have dimensions that match the internal geometry of the cap 2302.

Figure 23B:
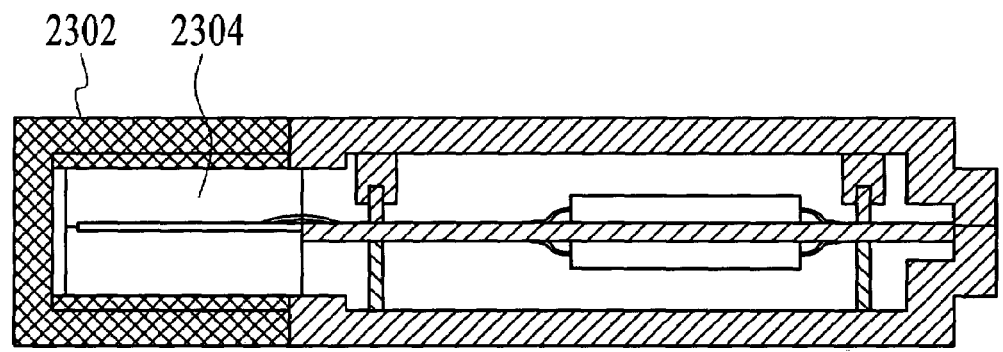
Figure 23C:
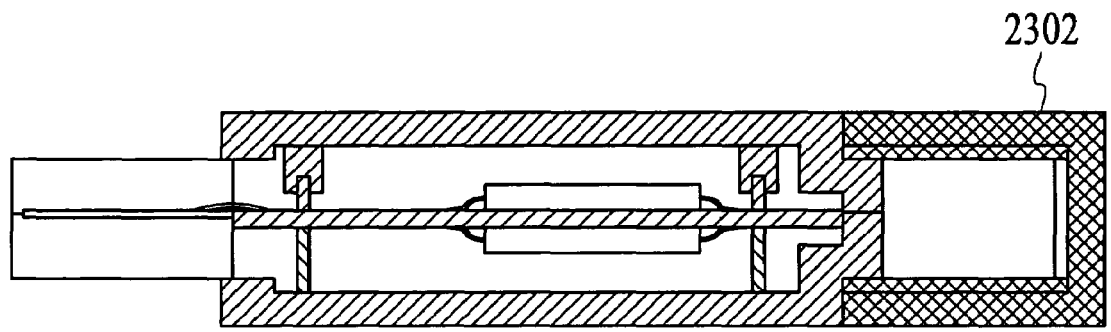

FIG. 23B is a side-view diagram of the flash memory assembly 2300 of FIG. 23A illustrating the USB connector 2304 inserted into the cap 2302 when the flash memory assembly 2300 is not in use. FIG. 23C is a side-view diagram of the flash memory assembly 2300 of FIG. 23A illustrating the housing inserted into the cap 2302 when the flash memory assembly 2300 is in use.

Figure 24A:
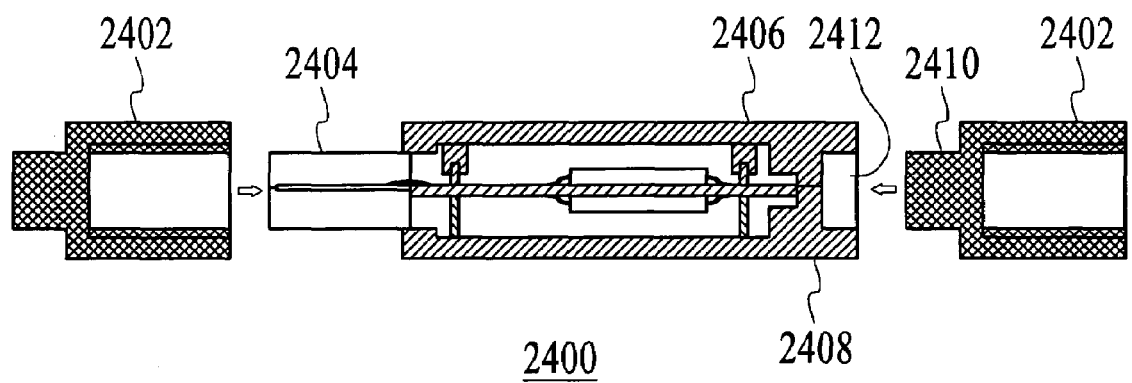
FIGS. 24A-C are side-view diagrams of a flash memory assembly including a cap that protects a USB connector in accordance with another embodiment of the present invention.

FIG. 24A is a side-view diagram of a flash memory assembly 2400 including a cap 2402 that protects a USB connector 2404 in accordance with another embodiment of the present invention. The flash memory assembly 2400 is similar to the flash memory assembly 2300 of FIGS. 23A-C except for the geometry of the cap 2402 and the geometry of the top and bottom covers 2406 and 2408. Specifically, a portion 2410 of the cap 2402 has dimensions the match the internal geometry of a recessed portion 2412 formed by the top and bottom covers 2406 and 2408.

Figure 24B:
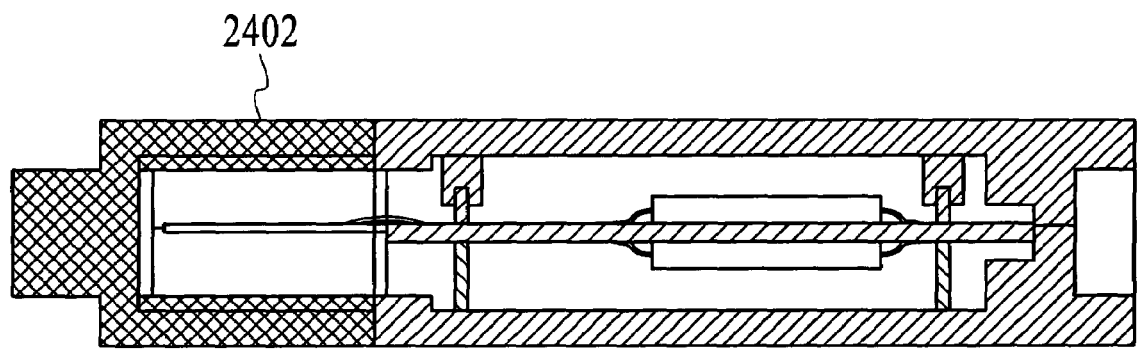
Figure 24C:
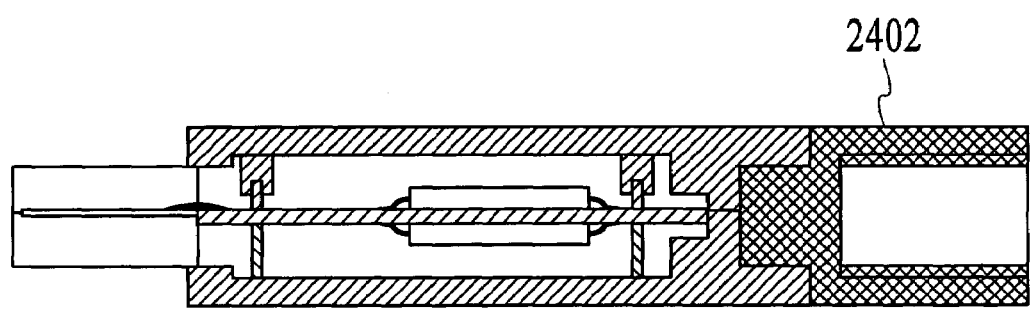

FIG. 24B is a side-view diagram of the flash memory assembly 2400 of FIG. 24A illustrating the USB connector 2404 inserted into the cap 2402 when the flash memory assembly 2400 is not in use. FIG. 24C is a side-view diagram of the flash memory assembly 2400 of FIG. 24A illustrating the housing inserted into the cap 2402 when the flash memory assembly 2400 is in use.

The flash memory assembly can be applied to flash memory components comprising USB Flash Drive, USB Flash Drive in Express Card mechanical form factor, PCI Express Drive in Express Card mechanical form factor.

According to the system and method disclosed herein, the present invention provides numerous benefits. For example, it accommodates high-capacity flash memory without having to increase the size of the assembly. Embodiments of the present invention also include features that result in a mechanically robust flash memory assembly.

A method and system has been disclosed for providing a flash memory assembly. The flash memory assembly is configured to accommodate multiple flash memory components on both sides of a printed circuit board, while maintaining a thin and compact size. Also, the flash memory assembly includes features that increase the durability of the flash memory assembly when being handled or transported.

Although the present invention has been described in accordance with the embodiments shown, one of ordinary skill in the art will readily recognize that there could be variations to the embodiments, and that those variations would be within the spirit and scope of the present invention. Accordingly, many modifications may be made by one of ordinary skill in the art without departing from the spirit and scope of the appended claims.

What is claimed is:

1. A flash memory assembly comprising:
   a connector;
   a printed circuit board (PCB) coupled to the connector, wherein the center of the PCB is positioned substantially at the center of one end of the connector;
   an electronic component coupled to one side of the PCB;
   a first cover coupled to the connector and having a planar first outer surface;
   a second cover coupled to the connector and having a planar second outer surface; and
   a cap having opposing planar third and fourth outer surfaces and defining an inside surface shaped such that, when the cap is removably coupled to the connector, a plurality of protrusions formed on the inside surface are inserted into corresponding recesses in the first and second covers, the third outer surface is co-planar with the first outer surface and the fourth outer surface is co-planar with the second outer surface.

2. The assembly of claim 1 further comprising a second electronic component coupled to a second side of the PCB.

3. The assembly of claim 1 wherein the connector is a universal serial bus connector.

4. The assembly of claim 2
   wherein the first cover comprises a first recessed portion, which receives and protects the first electronic component; and
   wherein second cover comprises a second recessed portion, which receives and protects the second electronic component.

5. The assembly of claim 1 wherein each electronic component comprises a flash memory controller and a flash memory component.

6. The assembly of claim 4 further comprising an interface that aligns the first and second covers when the first and second covers are joined.

7. The assembly of claim 4 wherein the cap is disposed over and protects the connector when the cap is removably coupled to the connector.

8. The assembly of claim 7 wherein the inside surface of the cap is formed such that the cap is slidable over the connector.

9. The assembly of claim 7 wherein the inside surface of the cap is formed such that the cap is slidable over a portion of the first cover and a portion of the second cover.

10. The assembly of claim 7 wherein the cap further comprises a portion disposed such that, when the cap is mounted on a second end of the assembly, the portion engages inside a recess formed by a portion of the first cover and a portion of the second cover, and the third planar surface is co-planar with the first planar surface and the fourth planar surface is co-planar with the second planar surface.

11. The assembly of claim 7 wherein the inside surface of the cap comprising plurality of ribs.

12. The assembly of claim 7 wherein the cap comprises a plurality of protrusions that are inserted into holes of the connector when the cap is mounted over the connector.

13. The assembly of claim 7 wherein the inside surface of the cap is formed such that the cap is slidable over the connector and partially over the first and second covers.

14. The assembly of claim 1 wherein the assembly can be applied to flash memory devices comprising USB Flash Drive, USB Flash Drive in Express Card mechanical form factor, PCI Express Drive in Express Card mechanical form factor.

15. A flash memory assembly comprising:
   a connector;
   a printed circuit board (PCB) coupled to the connector;
   an electronic component coupled to one side of the PCB;
   a first cover coupled to the connector;
   a second cover coupled to the connector;
   an interface that aligns the first and second covers when the first and second covers are joined; and
   a cap having an inside surface shaped such that, when the cap is removably coupled to the connector, a plurality of protrusions formed on the inside surface are inserted into corresponding recesses in the first and second covers, wherein the first cover comprises a plurality of alignment pins having a first dimension and said second cover comprises a plurality of alignment holes having a second dimension, wherein said first and second covers are engaged such that each said alignment pin is inserted into a corresponding said alignment hole, and wherein said first dimension is larger than said second dimension such that each said alignment pin is press-fit into its corresponding said alignment hole, whereby said first cover is fixedly snapped together with said second cover.

16. The assembly of claim 15 further comprising a second electronic component coupled to a second side of the PCB.

17. The assembly of claim 15 wherein the interface comprises:
- a plurality of pins coupled to the first cover; and
- a plurality of receptacles coupled to the second cover, wherein the PCB comprises a plurality of holes, wherein the each pin of the plurality of pins passes through a respective hole of the plurality of holes and enters a respective receptacle when the first and second covers join together.

18. The assembly of claim 17 wherein the holes are notches.

19. The assembly of claim 15 wherein the first cover comprises a seat that supports the PCB.

20. The assembly of claim 15 wherein the first cover comprises an extrusion that laterally supports the PCB.

21. A flash memory assembly comprising:
- a connector;
- a printed circuit board (PCB) coupled to the connector;
- an electronic component coupled to one side of the PCB;
- a first cover coupled to the connector;
- a second cover coupled to the connector;
- an interface that aligns the first and second covers when the first and second covers are joined; and
- a cap that is removably coupled to the connector, wherein the cap comprises a plurality of protrusions, which are inserted into corresponding recesses in the first and second covers, wherein the first cover comprises a seat disposed to support the PCB, a vertical wall having an upper surface surrounding the seat, and a guard wall extending from the upper surface along an outside edge of the vertical wall, wherein said second cover includes a sidewall that is received inside said guard wall such that an end surface of the sidewall abuts the upper surface of the vertical wall, and wherein said first and second covers are engaged such that said end surface and said upper surface form an ultrasonic weld, whereby the first and second covers are fixedly secured together.

22. The assembly of claim 15 wherein the first cover comprises a plurality of second pins, and the second cover comprises a plurality of second receptacles, wherein the each second pin of the plurality of second pins is received by a respective second receptacles of the plurality of receptacles.

23. The assembly of claim 15 wherein the cap is disposed over and protects the connector when the cap is removably coupled to the connector.

24. The assembly of claim 23 wherein the inside surface of the cap is formed such that the cap is slidable over the connector.

25. The assembly of claim 23 wherein the inside surface of the cap is formed such that the cap is slidable over a portion of the first cover and a portion of the second cover.

26. The assembly of claim 23 wherein the cap further comprises a portion disposed such that, when the cap is mounted on a second end of the assembly, the portion engages inside a recess formed by a portion of the first cover and a portion of the second cover, and the third planar surface is co-planar with the first planar surface and the fourth planar surface is co-planar with the second planar surface.

27. The assembly of claim 23 wherein the inside surface of the cap comprising plurality of ribs.

28. The assembly of claim 23 wherein the cap comprises a plurality of protrusions that are inserted into holes of the connector when the cap is mounted over the connector.

29. The assembly of claim 23 wherein the inside surface of the cap is formed such that the cap is slidable over the connector and partially over the first and second covers.

30. The assembly of claim 29 wherein the cap comprises a plurality of protrusions, which are inserted into corresponding recesses in the top and bottom covers.

31. The assembly of claim 15 wherein the assembly can be applied to flash memory devices comprising USB Flash Drive, USE Flash Drive in Express Card mechanical form factor, PCI Express Drive in Express Card mechanical form factor.

* * * * *